US012684720B2

(12) United States Patent
Min

(10) Patent No.: US 12,684,720 B2
(45) Date of Patent: Jul. 14, 2026

(54) SLIDABLE DISPLAY DEVICE

(71) Applicant: Samsung Display Co., LTD., Yongin-si (KR)

(72) Inventor: Myungan Min, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 417 days.

(21) Appl. No.: 18/211,703

(22) Filed: Jun. 20, 2023

(65) Prior Publication Data

US 2024/0090149 A1 Mar. 14, 2024

(30) Foreign Application Priority Data

Sep. 14, 2022 (KR) ........................ 10-2022-0115337

(51) Int. Cl.
H05K 5/00 (2025.01)
H05K 5/03 (2006.01)
(52) U.S. Cl.
CPC ...................................... H05K 5/03 (2013.01)
(58) Field of Classification Search
CPC ........ H05K 5/03; B32B 2457/20; B32B 3/04; B32B 27/08; B32B 27/283; B32B 27/306; B32B 2307/7376; B32B 7/12; B32B 27/285; B32B 27/32; B32B 27/34; B32B 27/40; H10K 77/111; H10K 59/8792; H10K 50/84; H10K 2102/311; G06F 1/1637; G06F 1/1643; G06F 1/1652; G06F 1/1624; G09F 9/301
See application file for complete search history.

(56) References Cited

U.S. PATENT DOCUMENTS

| | | | |
|---|---|---|---|
| 8,722,788 B2 | 5/2014 | Schultes et al. | |
| 11,619,975 B2* | 4/2023 | Cai ........................ | G06F 1/1652 |
| | | | 361/679.01 |
| 2016/0139455 A1* | 5/2016 | Yu ........................ | G02F 1/13394 |
| | | | 349/42 |
| 2018/0151641 A1* | 5/2018 | Choo ................. | G06V 40/1306 |
| 2019/0204867 A1* | 7/2019 | Song .................... | G09G 3/3208 |
| 2019/0348630 A1* | 11/2019 | Jung ....................... | H10K 59/87 |
| 2021/0202460 A1* | 7/2021 | Shin .................... | H10K 50/844 |
| 2022/0046811 A1 | 2/2022 | Kim et al. | |
| 2022/0174823 A1* | 6/2022 | Kim .................... | H04M 1/0216 |
| 2022/0183173 A1* | 6/2022 | Kim ..................... | G06F 1/1698 |
| 2022/0255023 A1 | 8/2022 | Cai et al. | |

(Continued)

FOREIGN PATENT DOCUMENTS

KR 101281333 B1 7/2013

*Primary Examiner* — Rockshana D Chowdhury
(74) *Attorney, Agent, or Firm* — CANTOR COLBURN LLP

(57) ABSTRACT

A display device includes a display panel including a first area and a second area, which are arranged in a first direction, a cover layer disposed on a rear surface of the display panel to overlap the first area, a first support layer disposed below the cover layer to overlap the first area, where a plurality of openings is defined in the first support layer, and a second support layer disposed on the rear surface of the display panel to overlap the second area and spaced apart from the cover layer in the first direction. The cover layer includes an elastic layer including an elastomer and a primer layer disposed on a surface of the elastic layer and including a light blocking material.

19 Claims, 13 Drawing Sheets

(56)                    References Cited

U.S. PATENT DOCUMENTS

| | | | | |
|---|---|---|---|---|
| 2022/0276411 A1* | 9/2022 | Heo | .......................... | G02B 1/11 |
| 2022/0388276 A1* | 12/2022 | Wu | ........................... | B32B 7/12 |
| 2023/0209754 A1* | 6/2023 | Lee | ........................... | B32B 7/12 |
| | | | | 361/714 |
| 2024/0045471 A1* | 2/2024 | Wang | ................... | G06F 1/1652 |
| 2024/0090149 A1* | 3/2024 | Min | ..................... | G06F 1/1637 |
| 2024/0215190 A1* | 6/2024 | Lee | ......................... | B32B 27/08 |
| 2024/0278533 A1* | 8/2024 | Wu | ........................ | B32B 3/263 |
| 2026/0052883 A1* | 2/2026 | Kim | .................... | H04M 1/0266 |

* cited by examiner

FIG. 1A

SLIDABLE DISPLAY DEVICE

This application claims priority to Korean Patent Application No. 10-2022-0115337, filed on Sep. 14, 2022, and all the benefits accruing therefrom under 35 U.S.C. § 119, the content of which in its entirety is herein incorporated by reference.

BACKGROUND

1. Field

The disclosure herein relates to a display device, and more particularly, to a slidable display device.

2. Description of the Related Art

Display devices such as smart phones, digital cameras, notebook computers, navigation systems, and smart televisions provide an image to a user through a display screen. Such a display device may include a display panel that generates an image.

In recent years, various types of display devices have been developed with the development of technology. For example, foldable or rollable flexible display devices are being developed. The flexible display device that are capable of being variously modified in shape may be easily carried to improve user's convenience.

SUMMARY

Among flexible display devices, an expandable flexible display device may accommodate at least a portion of a display panel into a case or to withdraw the at least a portion of the display panel from the case as desired by using the folding characteristic of the display panel. Thus, a user may expand the display screen as desired. However, in the expandable flexible display device, the display panel may be damaged by an expansion operation.

The disclosure provides a display device in which a display panel is prevented from being damaged by an expansion operation.

An embodiment of the invention provides a display device including: a display panel including a first area and a second area, which are arranged in a first direction; a cover layer disposed on a rear surface of the display panel to overlap the first area; a first support layer disposed below the cover layer to overlap the first area, where a plurality of openings is defined in the first support layer; and a second support layer disposed on the rear surface of the display panel to overlap the second area and spaced apart from the cover layer in the first direction. In such an embodiment, the cover layer may include: an elastic layer including an elastomer; and a primer layer disposed on a surface of the elastic layer and including a light blocking material.

In an embodiment, the elastic layer may include at least one selected from thermoplastic polyurethane, silicone, elastolefin, thermoplastic olefin, polyamide, polyether block amide, synthetic polyisoprene, polybutadiene, fluoroelastomer, and ethylene-vinyl acetate.

In an embodiment, the elastic layer may consist of the elastomer.

In an embodiment, the elastic layer may not include the light blocking material.

In an embodiment, the primer layer may include a base resin and a light blacking material dispersed in the base resin.

In an embodiment, the primer layer may include about 70 weight percent (wt %) or greater and about 85 wt % or less of the base resin, and about 15 wt % or greater and about 30 wt % or less of the light blocking material, based on a total content of the primer layer.

In an embodiment, the elastic layer may include a top surface adjacent to the display panel and a bottom surface adjacent to the first support layer. In an embodiment, the primer layer may include a first primer layer disposed on the top surface and a second primer layer disposed on the bottom surface.

In an embodiment, the display device may further include an adhesive layer disposed between the display panel and the cover layer.

In an embodiment, the elastic layer may include a top surface adjacent to the display panel. In such an embodiment, the primer layer may be disposed directly on the top surface of the elastic layer, and the adhesive layer may be disposed directly on a top surface of the primer layer.

In an embodiment, the primer layer may have a thickness of about 0.5 micrometers (μm) or greater and about 2 μm or less.

In an embodiment, the elastic layer may have a modulus of about 150 megapascals (MPa) or greater and about 300 MPa or less under a temperature of about −20° C.

In an embodiment, the plurality of openings may be arranged in a lattice shape on a plane.

In an embodiment, at least a portion of the first area of the display panel may be foldable about an axis extending in a second direction crossing the first direction.

In an embodiment, the display panel may further include a third area spaced apart from the second area with the first area therebetween, and a top surface of the second area and a top surface of the third area may face each other in a state where at least a portion of the first area is folded.

In an embodiment, the display device may further include a plurality of support bars disposed below the first support layer to be spaced apart from each other in the first direction, where each of the plurality of support bars may extend in a second direction crossing the first direction.

In an embodiment, the plurality of support bars may do not overlap the plurality of openings on a plane.

In an embodiment of the invention, a display device includes: a display panel including a first area and a second area, which are arranged in a first direction; a cover layer disposed on a rear surface of the display panel to overlap at least the first area; and a first support layer disposed below the cover layer, where a plurality of openings is defined in the support layer to overlap the first area. In such an embodiment, the cover layer may include: an elastic layer including thermoplastic polyurethane; and a primer layer disposed on a surface of the elastic layer and including polyurethane and a light blocking material.

In an embodiment, the display device may further include an adhesive layer disposed between the display panel and the cover layer. In such an embodiment, the primer layer may be disposed directly on the surface of the elastic layer, and the adhesive layer may be disposed directly on a top surface of the primer layer.

In an embodiment, the primer layer may include about 70 wt % or greater and about 85 wt % or less of the polyurethane, and about 15 wt % or greater and about 30 wt % or less of the light blocking material, based on a total content of the primer layer.

In an embodiment of the invention, a display device operates in a first mode and a second mode in which a display surface is expanded when a mode is changed from the first mode to the second mode. In such an embodiment, the display device includes: a display panel including a first area and a second area, which are arranged in a first direction; and a cover layer disposed on a rear surface of the display panel to overlap the first area. In such an embodiment, at least a portion of the first area is folded in the first mode. In such an embodiment, the cover layer includes: an elastic layer including an elastomer; and a primer layer disposed on a surface of the elastic layer and including a light blocking material.

BRIEF DESCRIPTION OF THE DRAWINGS

The accompanying drawings are included to provide a further understanding of embodiments of the invention, and are incorporated in and constitute a part of this specification. The drawings illustrate embodiments of the invention and, together with the description, serve to explain principles of the invention. In the drawings:

Figure 1A:
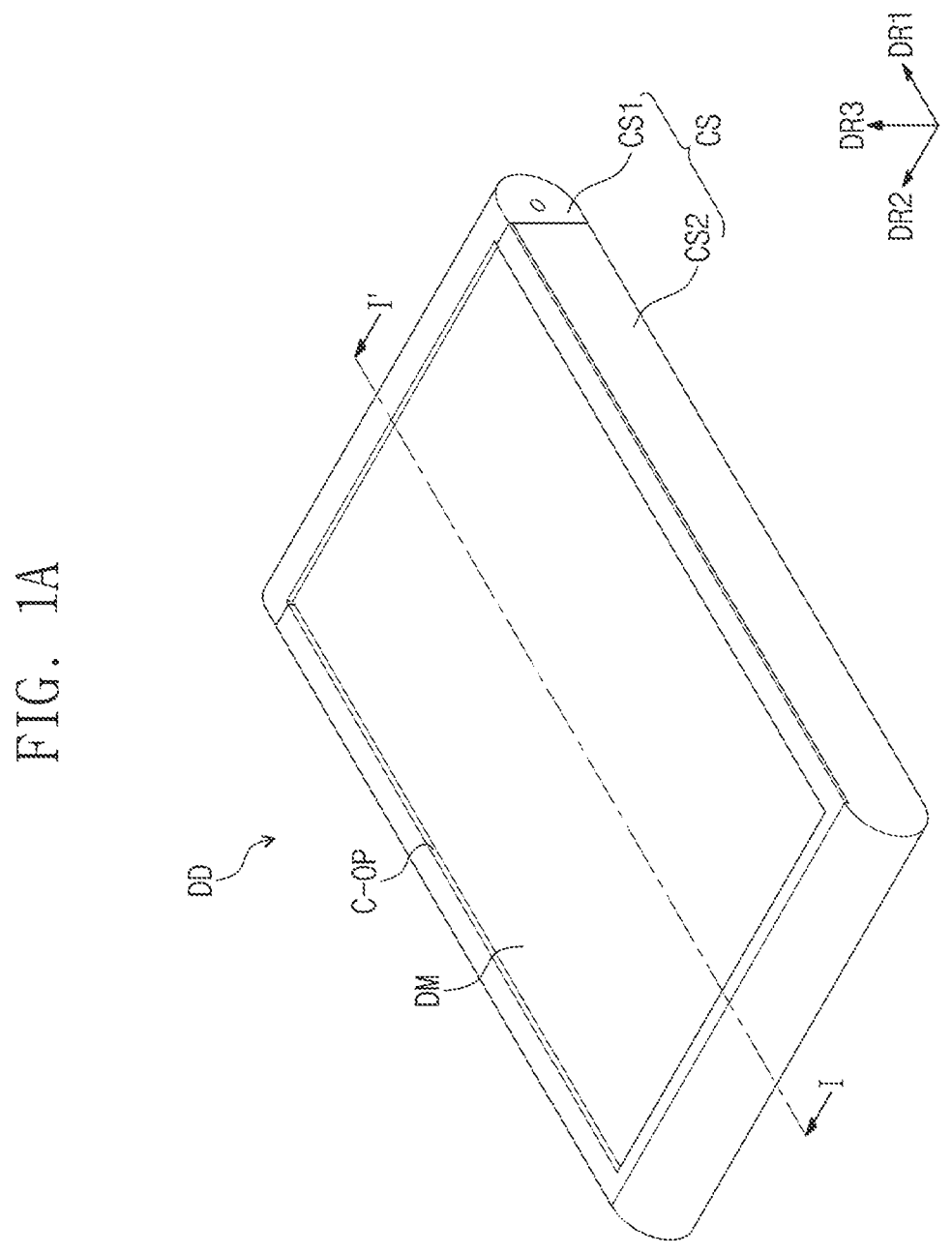

FIGS. 1A and 1B are perspective views of a display device according to an embodiment of the invention;

DETAILED DESCRIPTION

Figure 1B:
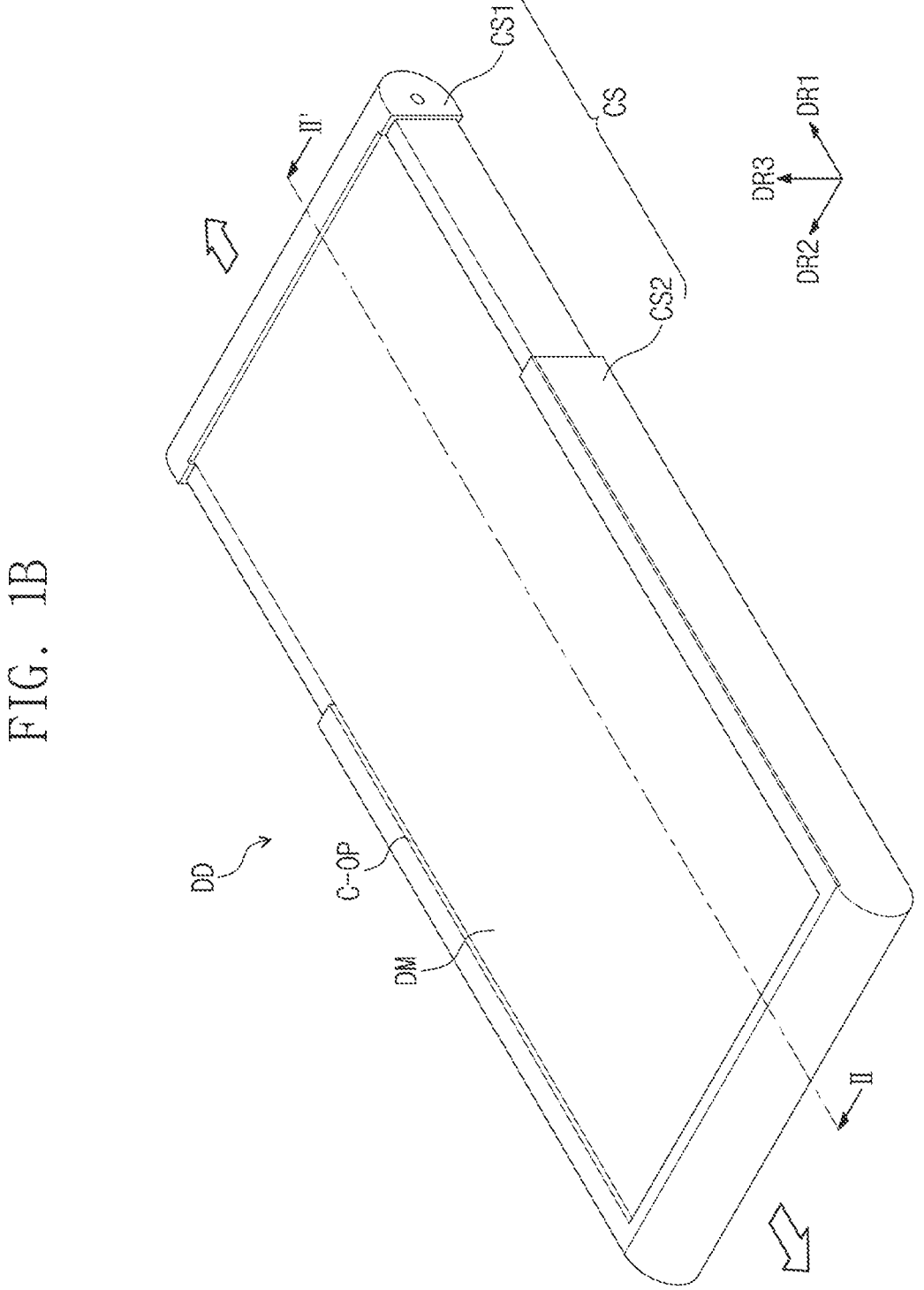

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when one component (or region, layer, portion, etc.) is referred to as being 'on', 'connected to', or 'coupled to' another component, it can be directly connected/coupled on/to the one component, or an intervening third component may also be present.

Like reference numerals refer to like elements throughout. Also, in the figures, the thickness, ratio, and dimensions of components are exaggerated for clarity of illustration.

It will be understood that although the terms such as 'first' and 'second' are used herein to describe various elements, these elements should not be limited by these terms. These terms are used only to distinguish one component from other components. For example, a first element referred to as a first element in an embodiment can be referred to as a second element in another embodiment without departing from the scope of the appended claims. The terms of a singular form may include plural forms unless referred to the contrary.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Also, "under", "below", "above", "upper", and the like are used for explaining relation association of components illustrated in the drawings. The terms may be a relative concept and described based on directions expressed in the drawings.

The meaning of "include" or "comprise" specifies a property, a fixed number, a step, an operation, an element, a component or a combination thereof, but does not exclude other properties, fixed numbers, steps, operations, elements, components or combinations thereof.

In this specification, "being directly disposed" may mean that there is no layer, film, area, plate, or the like between a portion of the layer, the film, the area, the plate, or the like and the other portion. For example, "directly disposed" may mean being disposed without using an additional member such and an adhesion member between two layers or two members.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within $\pm 30\%$, 20%, 10% or 5% of the stated value.

Unless otherwise defined, all terms (including technical and scientific terms) used herein have the same meaning as commonly understood by a person of ordinary skill in the art to which the invention belongs. In addition, terms such as terms defined in commonly used dictionaries should be interpreted as having a meaning consistent with the meaning in the context of the related technology, and unless explicitly defined here, they are interpreted as too ideal or too formal sense.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

FIGS. 1A and 1B are perspective views of a display device according to an embodiment of the invention. FIG.

1A is a perspective view of the display device DD that operates in a first mode, and FIG. 1B is a perspective view of the display device DD that operates in a second mode.

The display device DD may be a device that is activated according to an electrical signal to display an image. The display device DD may include various embodiments. In an embodiment, for example, the display device DD may include large-sized devices such as televisions, external billboards and the like, and small and medium-sized devices such as monitors, smartphones, tablet computers, navigation systems, game consoles, and the like. In an embodiment, the display device DD may be a slidable smartphone as show in FIGS. 1A and 1B.

Referring to FIGS. 1A and 1B, an embodiment of the display device DD may include a display module DM and a case CS in which the display module DM is accommodated. At least a portion of the display module DM may be exposed to the outside through a display opening C-OP defined in an upper portion of the case CS.

The case CS may include a first case CS1 and a second case CS2. The first case CS1 and the second case CS2 may be coupled to each other to accommodate the display module DM. The first case CS1 may be movably coupled to the second case CS2 to move in a direction parallel to a first direction DR1. The first case CS1 may be coupled to the second case CS2 to move closer to or away from the second case CS2.

A display surface of the display module DM exposed by the display opening C-OP may be parallel to each of the first direction DR1 and a second direction DR2 crossing the first direction DR1. The display module DM may display an image in a third direction DR3 on the display surface parallel to the first direction DR1 and the second direction DR2.

In this specification, the third direction DR3 may be defined as a direction substantially perpendicular to a plane defined by the first direction DR1 and the second direction DR2. The third direction DR3 may be a thickness direction of the display device DD. A front surface (or top surface) and a rear surface (or bottom surface) of each of members constituting the display device DD may be opposed to each other in the third direction DR3, and a normal direction of each of the front and rear surfaces may be substantially parallel to the third direction DR3. A spaced distance between the front surface and the rear surface defined along the third direction DR3 may correspond to a thickness of the member (or unit).

In this specification, the term "on a plane" may be defined as a state when viewed in the third direction DR3. In this specification, "on the cross-section" may be defined as a state when viewed from the first direction DR1 or the second direction DR2. The directions indicated as the first to third directions DR1, DR2, and DR3 may be a relative concept and thus changed into different directions.

Referring to FIGS. 1A and 1B, a surface area of the display surface of the display module DM, which is exposed by the display opening C-OP of the case CS, may be adjusted or changed according to movement of the first case CS1. As the first case CS1 moves, an opening area of the display opening C-OP may increase in the first direction DR1.

The display module DM may be a flexible display module and may be supported by a support layer disposed under the display module DM. When the first case CS1 moves in the first direction DR1, the support layer connected to the first case CS1 may also move in the first direction DR1. Thus, the display module DM disposed on the support layer may also move in the first direction DR1 according to the movement of the first case CS1. As an end of the display module DM moves in the first direction DR1 together with the first case CS1, a portion of the display module DM accommodated in the second case CS2 in a first mode may be exposed to the outside, and the display surface of the display module DM, which is exposed through the display opening C-OP, may be expanded.

FIG. 1A illustrates an embodiment of the display device DD in the first mode in which the first case CS1 is disposed closest to the second case CS2 in the first direction DR1 in the operation state of the display device DD. In the first mode, a portion extending from one area of the display module DM, which is exposed by the display opening C-OP, may be folded (e.g., curved or rolled) to a predetermined curvature and accommodated in the second case CS2. The first mode in which the display surface of the display module DM is set to a basic (or minimum) size may be defined as a basic mode.

FIG. 1B illustrates an embodiment of the display device DD in the second mode in which the first case CS1 is most spaced apart from the second case CS2 in the first direction DR1 in the operation state of the display device DD. In the display device DD operating in the second mode, an area of the display surface of the display module DM, which is exposed by the display opening C-OP, may be expanded when compared to the surface area of the display device DD in the first mode. That is, the second mode in which the display surface in the basic mode is expanded may be defined as an expanded mode.

The first mode and the second mode of the display device DD may be determined according to sliding operations of the case CS and the display module DM. As the user allows the display device DD to operate from the first mode to the second mode, the display surface of the display device DD may be expanded, and an image may be seen through the expanded display surface. Also, as the user allows the display device DD to operate from the second mode to the first mode, the display surface of the display device DD may be reduced, and the image may be seen through the reduced display surface. That is, the user may select any one of the first mode and the second mode of the display device DD to variously adjust the surface area of the display surface of the display device DD, which is exposed from the case CS.

Figure 2A:
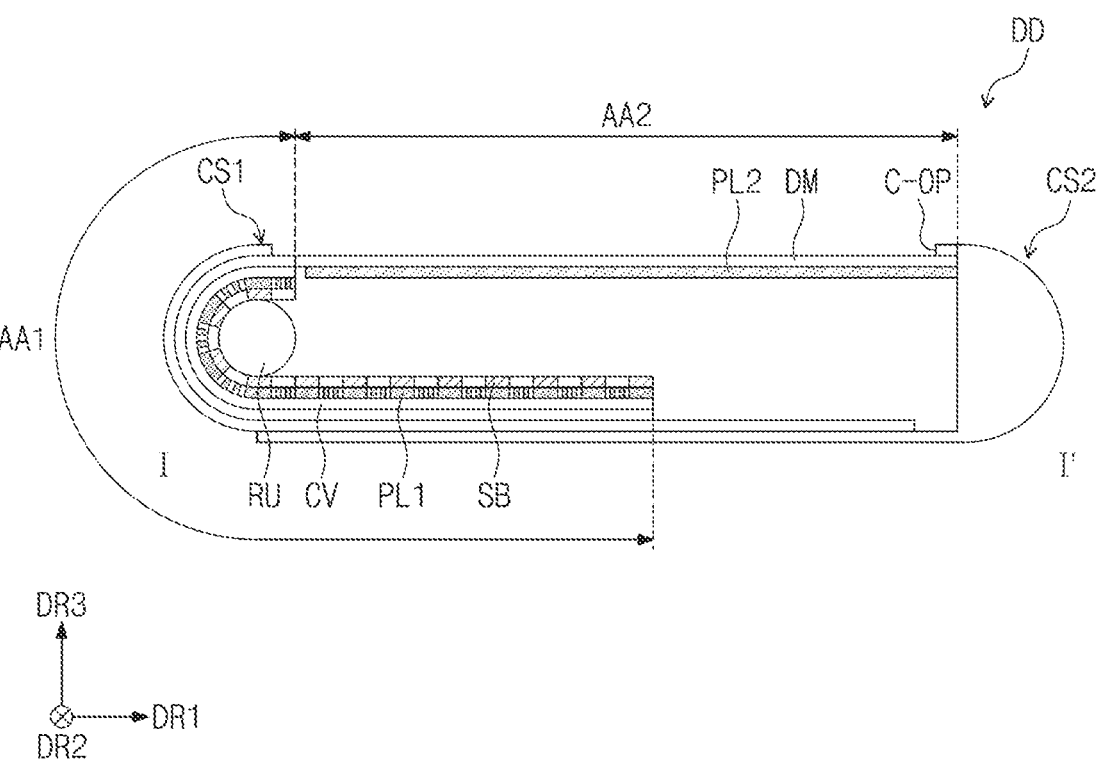
FIGS. 2A and 2B are cross-sectional views of the display device according to an embodiment of the invention.
Figure 2B:
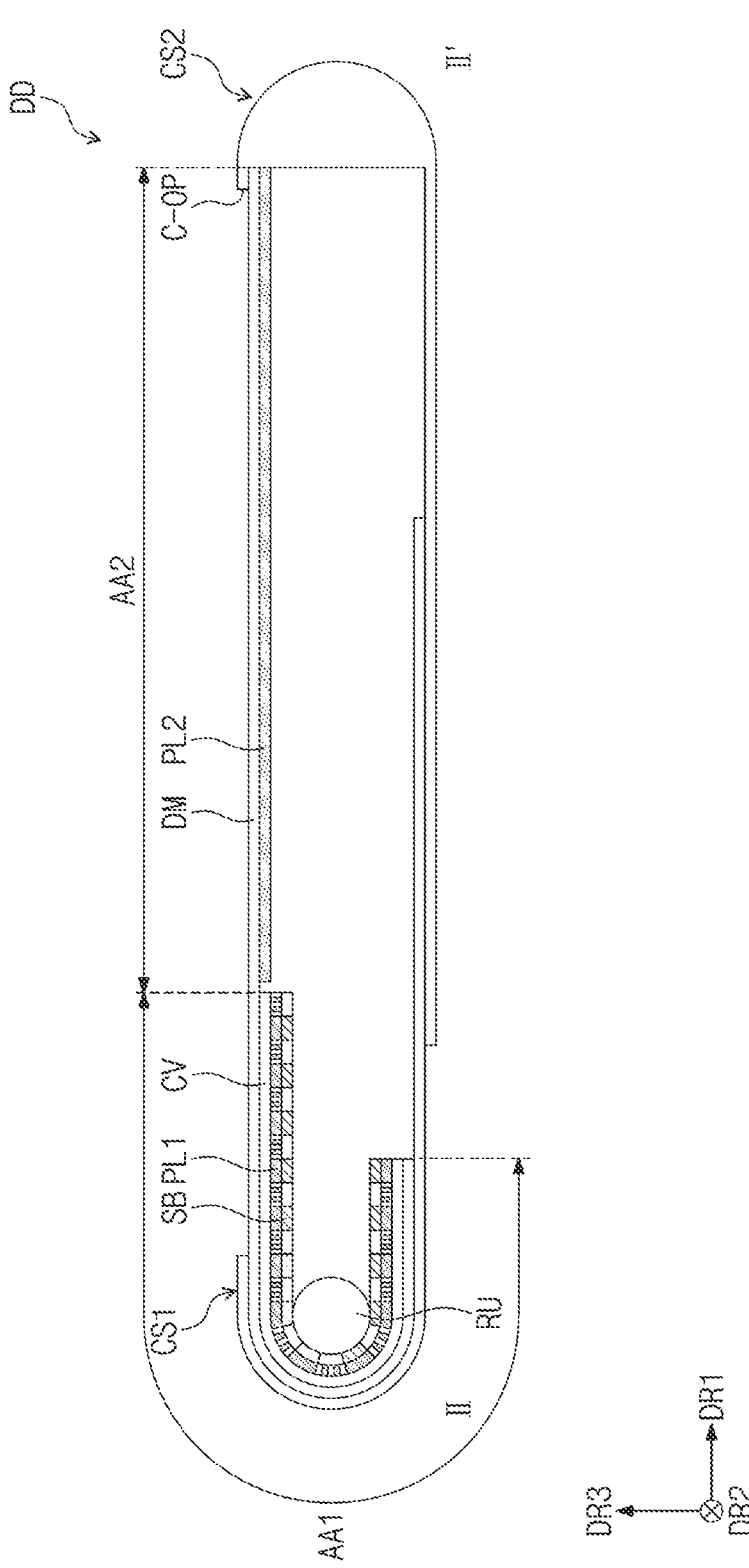

FIGS. 2A and 2B are cross-sectional views of the display device according to an embodiment of the invention. FIG. 2A is a cross-sectional view taken along line I-I' of FIG. 1A in the display device according to an embodiment. FIG. 2B is a cross-sectional view taken along line II-IF of FIG. 1B in the display device according to an embodiment. FIG. 2A corresponds to a cross-section of the display device DD in the first mode, and FIG. 2B corresponds to a cross-section of the display device DD in the second mode.

Referring to FIGS. 2A and 2B, an embodiment of the display device DD may include a case CS and a display module DM, a rotation unit RU, and a support module, which are accommodated in the case CS. The support module may be disposed under the display module DM to support the display module. The support module may include a cover member CV, a first support layer PL1, a second support layer PL2, and support bars SB.

The display module DM may include a first area AA1 and a second area AA2 extending from the first area AA1 in the first direction DR1. The first area AA1 may be an area supported by the cover member CV and the first support layer PL1, and the second area AA2 may be an area supported by the second support layer PL2.

Referring to FIG. 2A, in the first mode, a display surface of the display module DM corresponding to the second area AA2 may be exposed to the outside. In the first mode, the second area AA2 may be provided parallel to the first direction DR1 and the second direction DR2, and the second area AA2 may be defined as a planar area. A portion of the first area AA1 may be folded so that an end spaced apart from the second area AA2 overlaps the second area AA2 in the third direction DR3. The first area AA1 may be defined as a folding area. In the first mode, at least a portion of the first area AA1 may not be exposed to the outside. As illustrated in FIG. 2A, in the first mode, only a portion of the first area AA1 adjacent to the second area AA2 may be exposed to the outside. In this specification, meaning "area/portion and area/portion correspond to each other" means that area/portion and area/portion overlap each other, but is not limited to a case having a same surface area as each other.

The rotation unit RU may be accommodated in the second case CS2. The rotation unit RU may rotate about a rotation axis parallel to one direction. FIGS. 2A and 2B illustrate the rotation unit RU that is rotatable about a rotation axis parallel to the second direction DR2. The rotation unit RU may be coupled to the second case CS2 to rotate about the rotation axis according to a sliding operation of the first case CS1, which moves away from or closer to the second case CS2.

The first case CS1 of FIG. 2A may move away from the second case CS2 in the first direction DR1 to be in the second mode state illustrated in FIG. 2B. When the display device DD operates from the first mode to the second mode, the end of the second area AA2 of the display module DM, which is spaced apart from the first area AA1, may be coupled to be fixed to the first case CS1 to move together with the movement of the first case CS1. Here, the end of the first area AA1 of the display module DM, which is spaced apart from the second area AA2, may move in an opposite direction to the end of the second area AA2, which is coupled to the first case CS1.

A portion of the first area AA1 of the display module DM and a portion of the cover member CV, the first support layer PL1, and the support bars SB, which support the first area AA1 of the display module DM, may be disposed on a curved surface of the rotation unit RU and be folded (e.g., curved or rolled) to have a predetermined curvature. As the display module DM moves when operating (or changing the mode thereof) from the first mode to the second mode, the first area AA1, the cover member CV, the first support layer PL1, and the support bars SB of the display module DM may move along the curved surface of the rotation unit RU. According to an embodiment, a portion of the display surface corresponding to the first area AA1 in the first mode may be exposed to the outside, and when operating from the first mode to the second mode, a surface area by which the first area AA1 is exposed by the display opening C-OP may be expanded. In the first mode, the display surface corresponding to the first area AA1 may not be exposed to the outside.

The support module supporting the first area AA1 folded along the curved surface of the rotation unit RU in the first mode and the second mode and the support module supporting the second area AA2 that maintains the flat state in the first mode and the second mode may have predetermined mechanical properties, which are different from each other, and thus may include different configurations from each other. In an embodiment, for example, the support module supporting the first area AA1 of the display module DM may include the cover member CV, the first support layer PL1, and the support bars SB, and the support module supporting the second area AA2 may include the second support layer PL2.

Since the support modules have different configurations depending on the area of the display module DM, a gap may exist between the configurations of the support modules arranged side by side on a plane. In an embodiment, for example, the cover member CV and the second support layer PL2 arranged side by side on the plane may be spaced apart from each other in the first direction DR1 as individual configurations. That is, the gap may exist between the cover member CV and the second support layer PL2.

The cover member CV, the first support layer PL1, the second support layer PL2, and the support bars SB will be described in detail with reference to the accompanying drawings.

Figure 3:
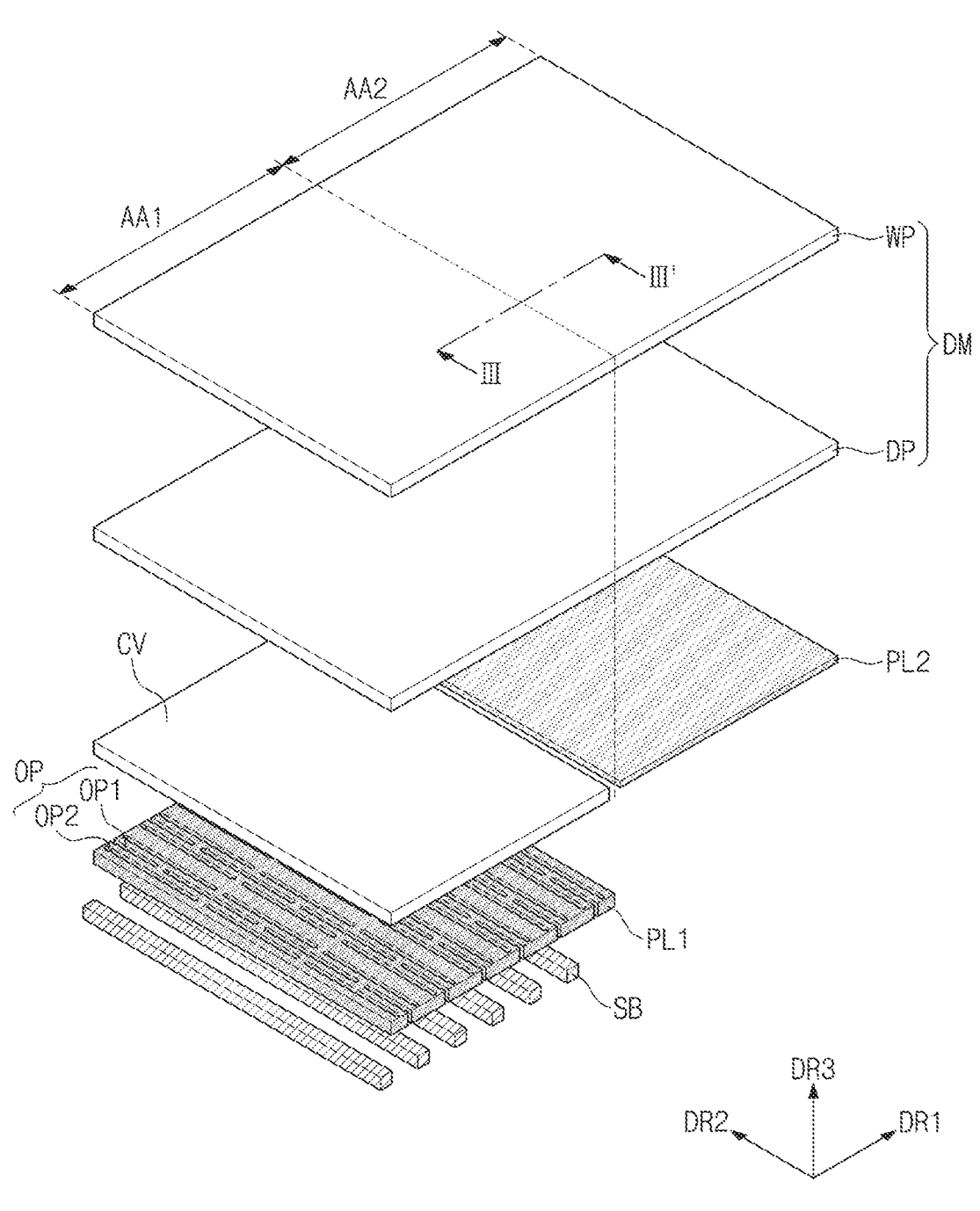
FIG. 3 is an exploded perspective view of the display device according to an embodiment of the invention.

FIG. 3 is an exploded perspective view of the display device according to an embodiment of the invention. The same or like elements shown in FIG. 3 have been labeled with the same reference characters as used above to describe the embodiment of the display device shown in FIGS. 1A to 2B, and any repetitive detailed description thereof will hereinafter be omitted or simplified. Referring to FIG. 3, the cover member CV, the first support layer PL1, the second support layer PL2, and the support bars SB will be mainly described.

Referring to FIG. 3, the display module DM may include a display panel DP and a window WP disposed on the display panel DP. The window WP may cover an entire top surface of the display panel DP. The window WP may protect the display panel DP from external impacts and scratches.

The window WP may include an optically transparent insulating material. In an embodiment, for example, the window WP may include glass, sapphire, or a polymer. The window WP may have a single-layered or multi-layered structure. The window WP may further include a functional layer such as an anti-fingerprint layer, a phase control layer, or a hard coating layer disposed on an optically transparent substrate.

The configuration of the display module DM is not limited thereto and may further include functional layers disposed between the window WP and the display panel DP. In an embodiment, for example, the display module DM may further include at least one selected from a protective layer, an anti-reflection layer, and an input sensing layer, which is disposed on the display panel DP.

The display panel DP may include a first area AA1 and a second area AA2, which correspond to the first area AA1 and the second area AA2 of the above-described display module DM, and the description thereof may be equally applied. In FIG. 3, the first area AA1 and the second area AA2 are displayed on a top surface of the window WP for convenience of illustration.

The display panel DP according to an embodiment may be an emission type display panel, but is not particularly limited thereto. In an embodiment, for example, the display panel DP may be an organic light emitting display panel or an inorganic light emitting display panel. An emission layer of the organic light emitting display panel may include an organic light emitting material. An emission layer of the inorganic light emitting display panel may include an inorganic light emitting material such as quantum dots or quantum rods. Alternatively, the emission layer of the display panel may include a micro light emitting element such as a micro light emitting diode (LED) and/or a nano LED.

The display panel DP according to an embodiment will be described later in detail with reference to FIGS. 4 and 5.

The cover member CV may be disposed on a rear surface of the display panel DP. The cover member CV may overlap the first area AA1 of the display panel DP. The cover member CV may be parallel to each of the first direction DR1 and the second direction DR2 in the unfolded state. The cover member CV may protect the rear surface of the display panel DP corresponding to the first area AA1 and may not overlap the second area AA2.

The cover member CV may include a material having flexibility. In an embodiment, for example, the cover member CV may include a polymer material. The cover member CV may support the first area AA1 of the display panel DP that is folded to have a predetermined curvature to reduce stress caused by the folding. Also, the cover member CV may prevent foreign substances from being introduced into the display panel DP through an openings OP defined in the first support layer PL1 disposed on a lower portion. In the second area AA2 that is not folded even during the operation in the first mode and the second mode, stress relief by the folding may not occur, and an opening may not be defined in the second support layer PL2 disposed under the display panel DP, and thus, the cover member CV may not be disposed. Thus, the laminated structure of the display device DD corresponding to the second area AA2 may be simplified.

The second support layer PL2 may be disposed on the rear surface of the display panel DP. The second support layer PL2 may overlap the second area AA2 of the display panel DP. The second support layer PL2 may have a plate shape parallel to the first direction DR1 and the second direction DR2. The second support layer PL2 may protect the rear surface of the display panel DP corresponding to the second area AA2 and may not overlap the first area AA1.

The second support layer PL2 may include a material having predetermined rigidity. In an embodiment, for example, the second support layer PL2 may include stainless steel, aluminum, or an alloy thereof. However, the material of the second support layer PL2 is not limited to the above example. The second support layer PL2 may support the rear surface of the display panel DP so that the second area AA2 of the display panel DP is maintained in the flat state in the first mode and the second mode. Also, the second support layer PL2 may improve impact resistance of the display panel DP.

The cover member CV may include a material different from that of the second support layer PL2. The second support layer PL2 may have a modulus greater than that of the cover member CV. The cover member CV may support the first area AA1 of the display panel DP to relieve the stress due to the folding, and the second support layer PL2 is not limited to any one embodiment as long as the second support layer PL2 supports the second area AA2 of the display panel DP to become the flat state.

The cover member CV and the second support layer PL2 may be disposed parallel to each other on the rear surface of the display panel DP. In an embodiment, for example, one end of the cover member CV may face one end of the second support layer PL2 in the first direction DR1. The cover member CV may be spaced apart from the second support layer PL2 in the first direction DR1.

The first support layer PL1 may be disposed below the cover member CV. The first support layer PL1 may overlap the first area AA1 of the display panel DP. The first support layer PL1 may be parallel to each of the first direction DR1 and the second direction DR2 in the unfolded state. The first support layer PL1 may not overlap the second area AA2. The first support layer PL1 may be spaced apart from the second support layer PL2 on the plane.

The first support layer PL1 may include a material having predetermined rigidity. Thus, the first support layer PL1 may improve the impact resistance of the display panel DP corresponding to the first area AA1. In an embodiment, for example, the first support layer PL1 may include stainless steel, aluminum, or an alloy thereof. In an embodiment, the first support layer PL1 may include the same material as the second support layer PL2. However, the material of the first support layer PL1 is not limited to the above example.

A plurality of openings OP may be defined in the first support layer PL1 or be formed through the first support layer PL1. The first support layer PL1 may be relatively easily folded by the openings OP. That is, the first support layer PL1 may have rigidity and be easily folded at a predetermined curvature by the openings OP.

Each of the openings OP may extend in the second direction DR2. That is, a width of the openings OP in the second direction DR2 may be greater than a width of the opening OP in the first direction DR1. The openings OP may be arranged in a lattice shape. Thus, a lattice pattern may be formed on the first support layer PL1 by the openings OP.

The openings OP may include first openings OP1 and second openings OP2, which are arranged to be misaligned with each other in a direction parallel to the first direction DR1. The first openings OP1 and the second openings OP2 may be arranged in a row along the second direction DR2. However, this is merely an example, and the plurality of openings OP according to an alternative embodiment of the invention may all be arranged side by side in the second direction DR2 and are not limited to any one embodiment.

FIG. 3 illustrates an embodiment having a structure in which the openings OP are provided as a plurality of groups disposed in the second direction DR2, and one group includes first openings OP1 provided as one row and second openings OP2 disposed at opposing sides of the first openings OP1. However, this is merely an example, and the arrangement and intervals of the openings OP may be variously designed or modified according to the design of the display device DD, but are not limited thereto.

The support bars SB may be disposed below the second support layer PL2. Each of the support bars SB may extend in the second direction DR2. The support bars SB may be disposed to be spaced apart from each other in the first direction DR1. The support bars SB are provided as segments so that the first area AA1 of the display panel DP is easily folded along the curved surface of the rotation unit RU (see FIG. 2A).

The support bars SB may not overlap the openings OP of the first support layer PL1. Thus, the support bars SB may not deteriorate the folding characteristic of the first support layer PL1. However, the embodiment is not necessarily limited thereto, and a portion of the support bars SB may overlap the openings OP.

The support bars SB may include a metal having predetermined rigidity. In an embodiment, for example, the support bars SB may include a metal such as aluminum, stainless steel, or invar, or may a carbon fiber. However, in an alternative embodiment where the support bars SB are provided as segments to support the first area AA1 of the display panel DP, the material of the support bars SB is not limited to the above example.

Figure 4:
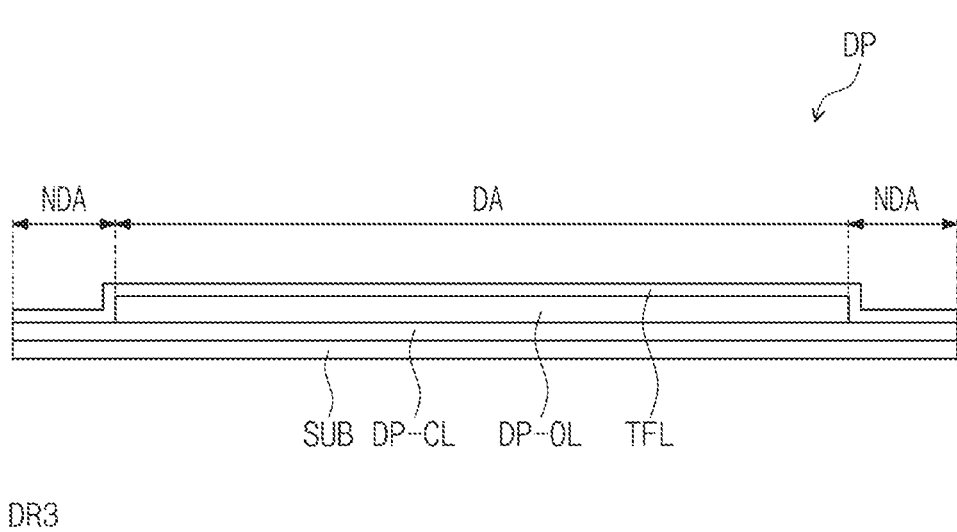
FIG. 4 is a cross-sectional view of the display panel according to an embodiment of the invention.

FIG. 4 is a cross-sectional view of the display panel according to an embodiment of the invention. FIG. 5 is a plan view of a display panel according to an embodiment of the invention;

Referring to FIG. 4, an embodiment of the display panel DP may include a base substrate SUB, a circuit element layer DP-CL, a display element layer DP-OL, and an encapsulation layer TFL. The circuit element layer DP-CL, the display element layer DP-OL, and the encapsulation layer TFL may be sequentially laminated on the base substrate SUB in the third direction DR3.

The base substrate SUB may provide a base surface, on which elements and lines of the display panel DP are disposed, on the plane parallel to each of the first and second directions DR1 and DR2. The base substrate SUB may include a display area DA and a non-display area NDA. The display area DA may be an area in which pixels are disposed to display an image. The non-display area NDA may be adjacent to the display area DA and may be an area in which an image is not displayed. The non-display area NDA may be an area in which the lines connected to the pixels to transmit a driving signal are disposed.

The base substrate SUB may include a flexible plastic substrate. In an embodiment, for example, the base substrate SUB may include at least one synthetic resin layer. The synthetic resin layer may include at least one selected from an acrylic-based resin, a methacrylic-based resin, a polyiso-prene-based resin, a vinyl-based resin, an epoxy-based resin, a urethane-based resin, a cellulose-based resin, a siloxane-based resin, a polyamide-based resin, a perylene-based resin, and a polyimide-based resin. However, a material of the base substrate SUB is not limited to the above example.

The circuit element layer DP-CL may be disposed on the base substrate SUB. The circuit element layer DP-CL may include at least one insulating layer, driving elements, signal lines, and signal pads. The circuit layer CL may include a conductive pattern and a semiconductor pattern forming the driving elements, the signal lines, and the signal pads.

The display element layer DP-OL may be disposed on the circuit element layer DP-CL. The display element layer DP-OL may include light emitting elements disposed to overlap the display area DA. The light emitting elements of the display element layer DP-OL may generate light within a display area DA based on signals provided from the driving elements by electrically connecting the circuit element layer DP-CL to the driving elements.

The encapsulation layer TFL may be disposed on the display element layer DP-OL to encapsulate the light emitting elements. The encapsulation layer TFL may include a plurality of thin films. The thin films of the encapsulation layer TFL may be disposed to improve optical efficiency of the light emitting element or protect the light emitting element. In an embodiment, the encapsulation layer TFL may include at least one inorganic layer and organic layer. The inorganic layer of the encapsulation layer TFL may protect the light emitting element from moisture/oxygen. The organic layer of the encapsulation layer TFL may protect the light emitting element from foreign substances such as dust particles.

Figure 5:
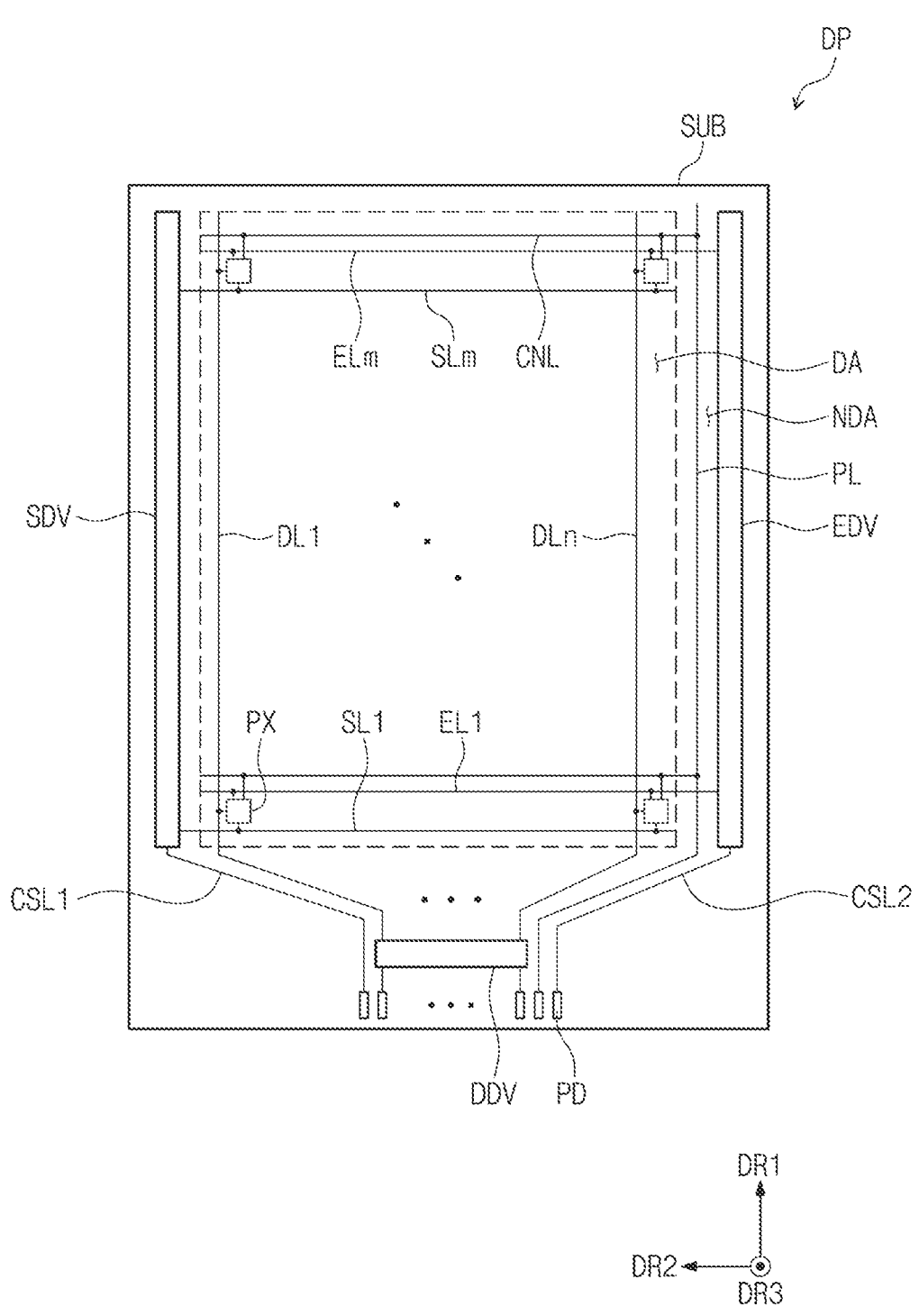
FIG. 5 is a plan view of a display panel according to an embodiment of the invention.

Referring to FIG. 5, an embodiment of the display panel DP may include a base substrate SUB, a plurality of pixels PX, a plurality of signal lines SL1 to SLm, DL1 to DLn, EL1 to ELm, CSL1, CSL2, PL, and CNL, which are electrically connected to the pixels PX, a scan driver SDV, a data driver DDV, and an emission driver EDV.

Each of the pixels PX may include a pixel driving circuit including a light emitting element, a plurality of transistors (e.g., a switching transistor, a driving transistor, etc.) connected to the light emitting element, and at least one capacitor.

The pixels PX may be disposed in the display area DA. Each of the pixels PX may emit light in response to an electrical signal applied to the pixel PX. However, a portion of the pixels PX may include a thin film transistor disposed on the non-display area NDA, but is not limited to any one embodiment.

In an embodiment, the scan driver SDV, the data driver DDV, and the emission driver EDV may be disposed on the non-display area NDA. However, the embodiment is not limited thereto, and at least one selected from the scan driver SDV, the data driver DIC, and the light emission driver EDV may be disposed on the display area DA, and thus, a surface area of the non-display area may be reduced.

The data driver DDV may be provided in the form of an integrated circuit chip defined as a driving chip and may be mounted on the non-display area NDA of the display panel DP. However, an embodiment of the invention is not limited thereto, and the data driver DDV may be mounted on a separate flexible circuit board connected to the display panel DP and electrically connected to the display panel DP.

The signal lines SL1 to SLm, DL1 to DLn, EL1 to ELm, CSL1, CSL2, PL, and CNL may include scan lines SL1 to SLm, data lines DL1 to DLn, emission lines EL1 to ELm, first and second control lines CSL1 and CSL2, a power line PL, and connection lines CNL. Here, m and n are natural numbers.

The data lines DL1 to DLn may be insulated from and cross the scan lines SL1 to SLm and the emission lines EL1 to ELm. In an embodiment, for example, the scan lines SL1 to SLm may extend in the second direction DR2 and be connected to the scan driver SDV. The data lines DL1 to DLn may extend in the first direction DR1 and be connected to the data driver DDV. The emission lines EL1 to ELm may extend in the second direction DR2 and be connected to the emission driver EDV.

The power line PL may extend in the second direction DR2 and be disposed on the non-display area NDA. In an embodiment, the power line PL may be disposed between the display area DA and the emission driver EDV. However, the arranged position of the power line PL is not limited thereto.

The connection lines CNL may extend in the first direction DR1 and may be arranged in the second direction DR2 to be connected to the power line PL and the pixels PX. Each of the connection lines CNL may be disposed in a layer different from a layer, in which the power line PL is disposed, and the connection lines CNL may be electrically connected to each other through a contact hole. However, an embodiment of the invention is not limited thereto, and the connection lines CNL may be integrally provided in a same layer as the power line PL. A power voltage may be applied to the pixels PX through the power line PL and the connection lines CNL, which are connected to each other.

The first control line CSL1 may be connected to the scan driver SDV. The second control line CSL2 may be connected to the emission driver EDV.

Pads PD may be disposed adjacent to a lower end of the non-display area NDA. The pads PD may be disposed closer to a lower end of the display panel DP than the data driver DDV. The pads PD may be disposed to be spaced apart from each other along the second direction DR2. The pads PD may be portions to which a circuit substrate or film for providing signals for controlling operations of the scan driver SDV, the data driver DDV, and the light emission driver EDV of the display panel DP is connected.

Each of the pads PD may be connected to the corresponding signal line among the signal lines. The power line PL and the first and second control lines CSL1 and CSL2 may be connected to the pads PD. The data lines DL1 to DLn may be electrically connected to corresponding pads PD through the data driver DDV.

The scan driver SDV may generate scan signals in response to scan control signals. The scan signals may be applied to the pixels PX through the scan lines SL1 to SLm. The data driver DDV may generate data voltages corresponding to image signals in response to data control signals. The data voltages may be provided to the pixels PX through the data lines DL1 to DLn. The emission driver EDV may generate emission signals in response to emission signals. The emission signals may be applied to the pixels PX through the emission lines EL1 to ELm.

The pixels PX may receive the data voltages in response to the scan signals. The pixels PX may emit light having luminance corresponding the data voltages in response to the emission signals to display an image. An emission time of the pixels PX may be controlled by the emission signals. Thus, the display panel DP may output an image through the display area DA by the pixels PX.

Figure 6:
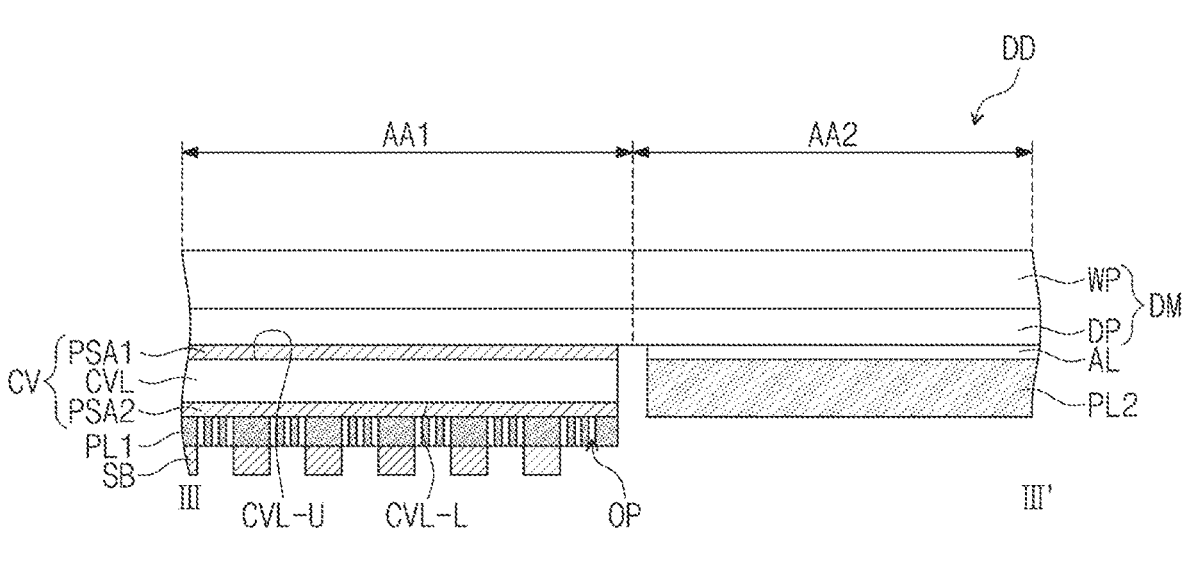
FIG. 6 is a cross-sectional view of the display device according to an embodiment of the invention.
Figure 6:
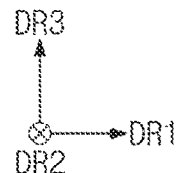

FIG. 6 is a cross-sectional view of the display device according to an embodiment of the invention. FIG. 6 is a cross-sectional view taken along line of FIG. 3. The same or like elements shown in FIG. 6 have been labeled with the same reference characters as used above to describe the embodiment of the display device shown in FIGS. 1A to 5, and any repetitive detailed description thereof will hereinafter be omitted or simplified.

Referring to FIG. 6, in an embodiment, the cover member CV, the first support layer PL1 and the support bars SB may be sequentially disposed on the rear surface of the display panel DP corresponding to the first area AA1 to support the display panel DP. The second support layer PL2 may be disposed on the rear surface of the display panel DP corresponding to the second area AA2 to support the display panel DP.

In an embodiment, the second support layer PL2 may be coupled to the rear surface of the display panel DP through a planar adhesive layer AL. The planar adhesive layer AL may include a transparent adhesive such as an optically clear adhesive film (OCA), an optically clear adhesive resin (OCR), or a pressure sensitive adhesive film (PSA). However, the type of adhesive provided in the planar adhesive layer AL is not limited thereto. In an alternative embodiment, the planar adhesive layer AL may be omitted.

Although FIG. 6 shows an embodiment where the thickness of the second support layer PL2 is thicker than that of the cover member CV, this is merely an example, and alternatively, the thickness of the second support layer PL2 may be less than that of the cover member CV. In addition, although FIG. 6 illustrates an embodiment where the second support layer PL2 has a single-layered structure, the embodiment of the invention is not limited thereto, and alternatively, the second support layer PL2 may include a plurality of different configurations, elements or components. In an embodiment, for example, the second support layer PL2 may include a plurality of different elements selected from a metal plate, a heat dissipation layer, an electromagnetic shielding layer, a cushion layer, and a digitizer.

The cover member CV may overlap the first area AA1 and may be coupled to the rear surface of the display panel DP.

In an embodiment, as shown in FIG. 6, the cover member CV may be spaced apart from the second support layer PL2 in the first direction DR1. However, the embodiment of the invention is not limited thereto, and alternatively, the cover member CV and the second support layer PL2 may be in contact with each other. In such an embodiment, a gap may not be defined between the cover member CV and the second support layer PL2, and one surface of the cover member CV and one surface of the second support layer PL2 may be in contact with each other.

In an embodiment, the cover member CV includes a cover layer CVL. The cover member CV may include the cover layer CVL and adhesive layers PSA1 and PSA2 disposed on at least one surface of the cover layer CVL.

The cover layer CVL may be a layer including the above-described flexible polymer material. The cover layer CVL may include a material having elasticity to support the first area AA1 of the display panel DP that is folded at a predetermined curvature, thereby reducing stress due to the folding. Also, the cover layer CVL may prevent foreign substances from being introduced into the display panel DP through the openings OP defined in the first support layer PL1 disposed on the lower portion. Since the cover layer CVL includes a material having a low modulus, stress applied when the display device DD operates in the first mode and the second mode may be reduced.

The cover layer CVL includes a top surface CVL-U adjacent to (or facing) the display panel DP and a bottom surface CVL-L adjacent to (or facing) the first support layer PL1, and the adhesive layers PSA1 and PSA2 may be disposed on at least one of the top surface CVL-U and the bottom surface CVL-L. In the display device DD according to an embodiment, the cover member CV may include the first adhesive layer PSA1 disposed on the top surface CVL-U of the cover layer CVL and the second adhesive layer PSA2 disposed on the bottom surface CVL-L of the cover layer CVL. The top surface CVL-U of the cover layer CVL may be in contact with the first adhesive layer PSA1, and the bottom surface CVL-L of the cover layer CVL may be in contact with the second adhesive layer PSA2. The display panel DP may adhere to the cover layer CVL through the first adhesive layer PSA1, and the first support layer PL1 may adhere to the cover layer CVL through the second adhesive layer PSA2. In an alternative embodiment, the second adhesive layer PSA2 may be omitted, and the cover layer CVL and the first support layer PL1 may be in contact with each other.

Referring to FIG. 6, when viewed in the second direction DR2 parallel to the extension direction of the support bars SB, a cross-sectional shape of each of the support bars SB may be a rectangular shape. That is, in each of the support bars SB, a surface area of the top surface facing the display panel DP and a surface area of the rear surface corresponding to the top surface may be substantially the same as each other. However, this is merely an example, and alternatively, each of the support bars SB may include a top surface having a small area compared to that of the rear surface. In an embodiment, for example, the cross-sectional shape of the support bars SB may be provided in various shapes such as an inverted triangle, an inverted trapezoid, and the like.

Figure 7A:
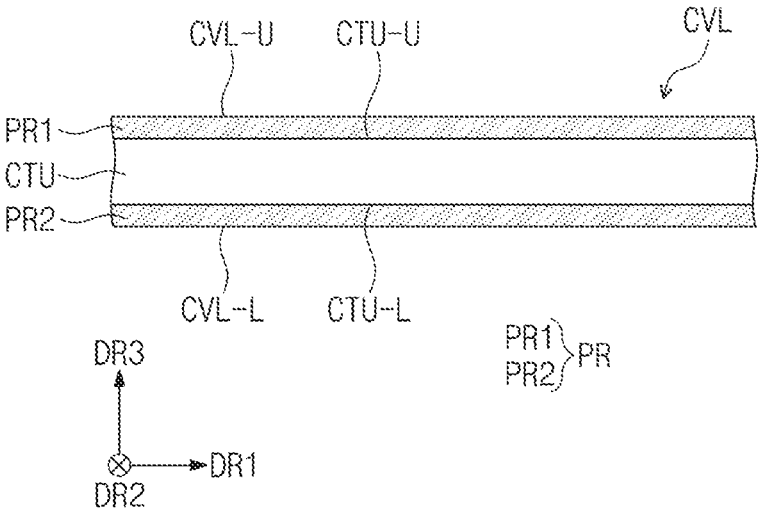
FIGS. 7A and 7B are cross-sectional views of a cover layer according to an embodiment of the invention.
Figure 7B:
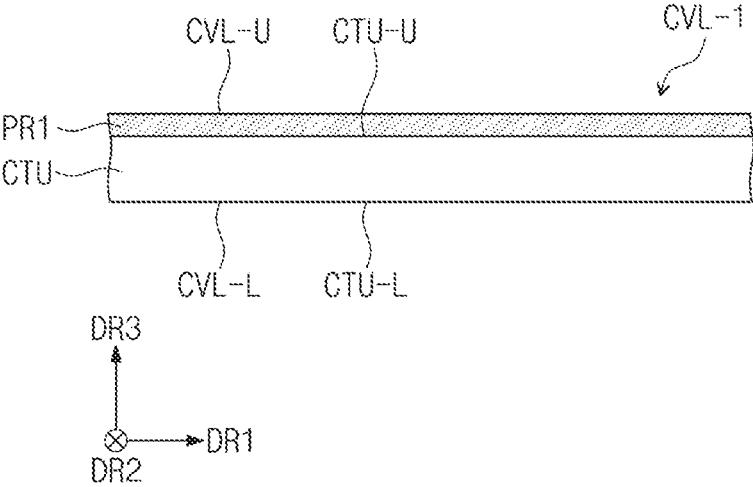

FIGS. 7A and 7B are cross-sectional views of the cover layer according to an embodiment of the invention.

Referring to FIGS. 7A and 7B, the cover layers CVL and CVL-1 according to an embodiment include an elastic layer CTU and a primer layer PR disposed on at least one surface of the elastic layer CTU. The primer layer PR may be disposed on at least one selected from a top surface CTU-U and a bottom surface CTU-L of the elastic layer CTU. In an embodiment, for example, as illustrated in FIG. 7A, the primer layer PR may include a first primer layer PR1 disposed on the top surface CTU-U of the elastic layer CTU and a second primer layer PR2 disposed on the bottom surface CTU-L of the elastic layer CTU. Alternatively, as illustrated in FIG. 7B, the primer layer may not be disposed on the bottom surface CTU-L of the elastic layer CTU, and only the first primer layer PR1 may be disposed on the top surface CTU-U of the elastic layer CTU. The primer layer PR may be disposed directly on at least one surface of the elastic layer CTU. As illustrated in FIG. 7A, the first primer layer PR1 may be in contact with the top surface CTU-U of the elastic layer CTU, and the second primer layer PR2 may be in contact with the bottom surface CTU-L of the elastic layer CTU.

The elastic layer CTU includes a material having flexibility. The elastic layer CTU includes an elastomer. The elastic layer CTU may include, for example, at least one selected from thermoplastic polyurethane, silicone, elastolefin, thermoplastic olefin, polyamide, polyether block amide, synthetic polyisoprene, polybutadiene, fluoroelastomer, and ethylene-vinyl acetate. In an embodiment, the elastic layer CTU may include, for example, thermoplastic polyurethane.

The elastic layer CTU may be provided as or defined by an elastomer. That is, the elastic layer CTU may include only the elastomer and may not include a material other than the elastomer. The elastic layer CTU may not include a light blocking material such as a black pigment and silica particles. The elastic layer CTU may include or be made of, for example, thermoplastic polyurethane. The elastic layer CTU may be provided as the elastomer and may do not include a light blocking material and a particulate mixture such as the silica particles, and thus, surface roughness may be low by maintaining the low modulus and improving the surface quality.

The elastic layer CTU may be optically transparent because the elastic layer CTU does not include a material other than the elastomer. The elastic layer CTU may have transmittance of about 70% or greater in a visible light range. The elastic layer CTU may have transmittance of about 70% or greater in a wavelength range of about 380 nanometers (nm) or greater and about 750 nm or less. A thickness of the elastic layer CTU may be, for example, about 5 micrometers ($\mu$m) or greater and about 30 $\mu$m or less.

The elastic layer CTU may have a low modulus in each of a low temperature, a room temperature, and a high temperature conditions. The elastic layer CTU may have a modulus of about 150 megapascals (MPa) or greater and about 300 MPa or less under the low temperature of about −20° C. In an embodiment, for example, the elastic layer CTU may have a modulus of about 200 MPa at the temperature of about −20° C. The elastic layer CTU may have a modulus of about 20 MPa or greater and about 30 MPa or less under the room temperature condition, that is, a temperature of about 25° C. In an embodiment, for example, the elastic layer CTU may have a modulus of about 25 MPa at the temperature of about 25° C. The elastic layer CTU may have a modulus of about 2 MPa or greater and about 10 MPa or less under the high temperature of about 60° C. In an embodiment, for example, the elastic layer CTU may have a modulus of about 5 MPa at the temperature of about 60° C.

The primer layer PR may be disposed on at least one surface of the elastic layer CTU and include a light blocking material. The primer layer PR may include the light blocking material and a base resin in which the light blocking material is dispersed. The primer layer PR may include the light blocking material and the base resin. In an embodiment, the primer layer PR may include only the light blocking material and the base resin and may not include other materials. The primer layer PR may include about 70 weight percent (wt %) or greater and about 85 wt % or less of the base resin, and about 15 wt % or greater and about 30 wt % or less of the light blocking material, based on a total content of the primer layer PR. In an embodiment, for example, the primer layer PR may include about 76 wt % of the base resin and about 24 wt % of the light blocking material, based on the total content of the primer layer PR. As the contents of the light blocking material and the base resin of the primer layer PR satisfy the above ranges, the primer layer PR may have high light absorbance and improve adhesion with an adjacent adhesive layer, and excessive stress may be prevented from in the cover layer CVL when the display device operates in the first mode and the second mode due to the excessively large modulus of the primer layer PR.

The light blocking material included in the primer layer PR may include a black pigment or a black dye. In an embodiment, for example, the light blocking material may include carbon black. The base resin contained in the primer layer PR may include a polymer resin. In an embodiment, for example, the base resin may include polyurethane.

The primer layer PR may have a thickness of about 0.5 $\mu$m or greater and about 2 $\mu$m or less. If the thickness of the primer layer PR is less than about 0.5 $\mu$m, an effect of improving the adhesion to the adjacent adhesive layer may be reduced. If the thickness of the primer layer PR is more than about 2 $\mu$m, the modulus of the primer layer PR may be excessively large, and thus, the excessive stress may occur in the cover layer CVL when the display device operates in the first mode and the second mode.

An outer surface of the primer layer PR may define an outer surface of the cover layer CVL. In an embodiment, a top surface of the first primer layer PR1 disposed on the top surface CTU-U of the elastic layer CTU may define the top surface CVL-U of the cover layer CVL. A bottom surface of the second primer layer PR2 disposed on the bottom surface CTU-L of the elastic layer CTU may define the bottom surface CVL-L of the cover layer CVL. In an embodiment where the second primer layer is omitted as illustrated in FIG. 7B, the bottom surface CTU-L of the elastic layer CTU may define the bottom surface CVL-L of the cover layer CVL.

The primer layer PR may be a layer including the light blocking material to have high light absorbance, including the particulate mixture such as the light blocking material, and including the base resin such as polyurethane to improve the adhesion with the adjacent adhesive layer. In an embodiment, for example, referring to FIGS. 6, 7A and 7B together, the top surface of the first primer layer PR1 disposed on the top surface CTU-U of the elastic layer CTU may define the top surface CVL-U of the cover layer CVL to be in contact with the first adhesive layer PSA1 provided in the above-described cover member CV, and the first primer layer PR1 may be a layer to improve the adhesion with the first adhesive layer PSA1. Referring to FIGS. 6, 7A and 7B together, the bottom surface of the second primer layer PR2 disposed on the bottom surface CTU-L of the elastic layer CTU may define the bottom surface CVL-L of the cover layer CVL to be in contact with the second adhesive layer PSA2 provided in the above-described cover member CV, and the second primer layer PR2 may be a layer to improve the adhesion with the second adhesive layer PSA2. The first adhesive layer PSA1 may be disposed directly on the first primer layer PR1, and the second adhesive layer PSA2 may be disposed directly below the second primer layer PR2.

In the display device according to an embodiment, the cover layer disposed below the display panel may include the elastic layer and the primer layer. Here, the elastic layer may be made of the elastomer such as thermoplastic polyurethane, and the primer layer disposed on one surface of the elastic layer may include the base resin and the light blocking material to improve the surface quality of the elastic layer and have a low modulus in each of the low temperature condition, the room temperature condition, and the high temperature condition. Thus, the stress applied to the cover layer may be reduced during the operation of the display device operating in the first mode and the second mode, and the stress applied to the cover layer may be transferred to the display panel to prevent defects such as cracks from occurring in the display panel.

In a case, where the elastic layer of the cover layer disposed below the display panel further includes the particulate mixture such as the light blocking material in addition to the elastomer, a shape of the particulate mixture on a surface of the elastic layer may be visually recognized from the outside, and the surface quality may be deteriorated. In this case, the modulus of the elastic layer may increase in each of the low temperature condition, the room temperature condition, and the high temperature condition, and in particular, the modulus of the elastic layer may greatly increase under the low temperature condition, and thus, when the display device operates in the first mode and the second mode, the stress applied to the elastic layer may increase. Thus, the stress applied to the elastic layer may be transmitted to the display panel, and the defects such as the cracks may occur in the display panel. In the display device according to an embodiment, since the elastic layer is made of the elastomer such as thermoplastic polyurethane, the surface of the elastic layer may be prevented from being visually recognized from the outside due to the increase in surface roughness by the particulate mixture, and thus, the surface quality may be improved. In such an embodiment, since the increasing in modulus of the elastic layer by the particulate may not occur, the defects such as the cracks in the display panel may be effectively prevented occurring, and durability of the display device including the display panel and the cover layer may be improved.

Evaluation results of Tables 1 and 2 below show a degree of surface visibility of each of the elastic layer provided in the cover layer according to an embodiment and the elastic layer according to a comparative example, and a modulus at each temperature condition. In Tables 1 and 2, the elastic layer according to the comparative example contains about 94.8 wt % of thermoplastic polyurethane TPU, about 2.7 wt % of carbon black, and 2.5 wt % of silica particles, and the elastic layer according to an embodiment contains 100% thermoplastic polyurethane, which is also the elastomer as described above. The degree of the surface visibility indicated a visibility index (Kc) measured using a surface quality measurement facility (Optimap).

TABLE 1

| Classification | Comparative Example | Embodiment |
|---|---|---|
| Kc | 1.94 | 0.49 |

TABLE 2

| Classification | Temperature | Comparative Example | Embodiment |
|---|---|---|---|
| Modulus (MPa) | Low temperature (−20° C.) | 977 | 201 |
|  | Room temperature (25° C.) | 113 | 23 |
|  | High temperature (60° C.) | 41 | 5 |

Referring to the results of Tables 1 and 2, in the case of the elastic layer made of the elastomer as in an embodiment, it is seen that the surface visibility index is low to about ¼ level when compared to the elastic layer according to the comparative example, which includes the particulate mixture, and the surface quality is improved. In addition, it is seen that the elastic layer according to an embodiment has a low modulus of about 31% under the low temperature, a modulus of about 20% under the room temperature, and a modulus of about 12% under the high temperature when compared to the elastic layer according to the comparative example. According to the results of Tables 1 and 2, it is seen that the elastic layer according to an embodiment has a low modulus in each of the low temperature, the room temperature, and the high temperature, and thus, it is seen that the display device including the elastic layer according to an embodiment is effectively prevented from being visually recognized from the outside, and the durability is improved.

Figure 8A:
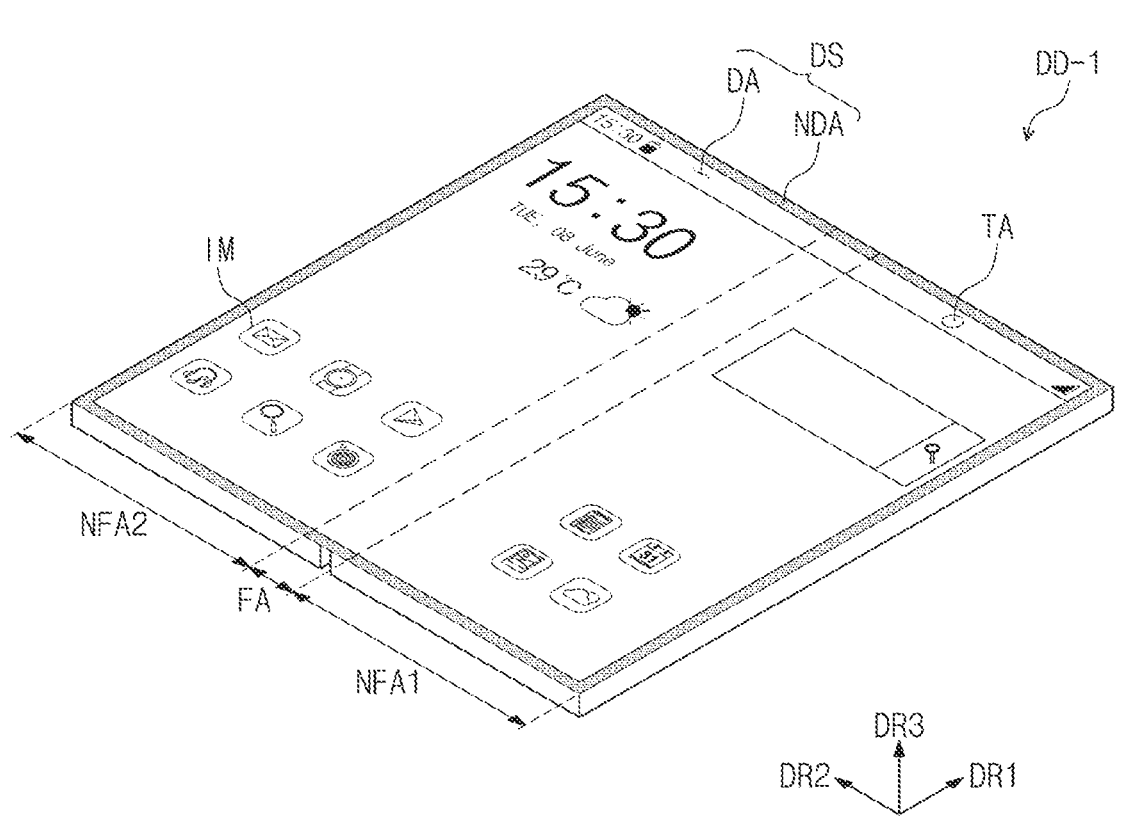
FIGS. 8A to 8C are perspective views of a display device according to an embodiment of the invention.
Figure 8B:
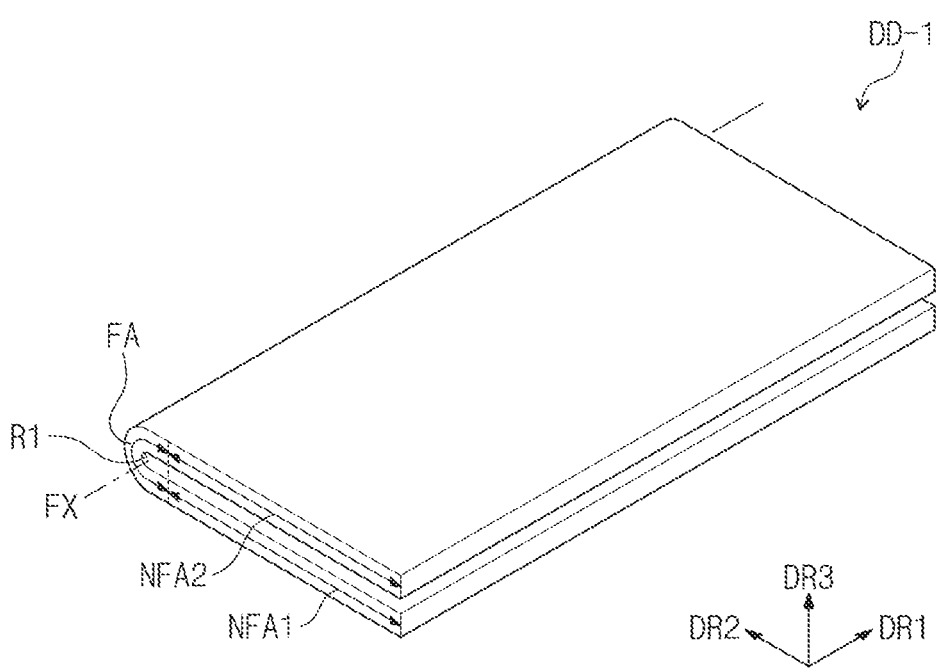
Figure 8C:
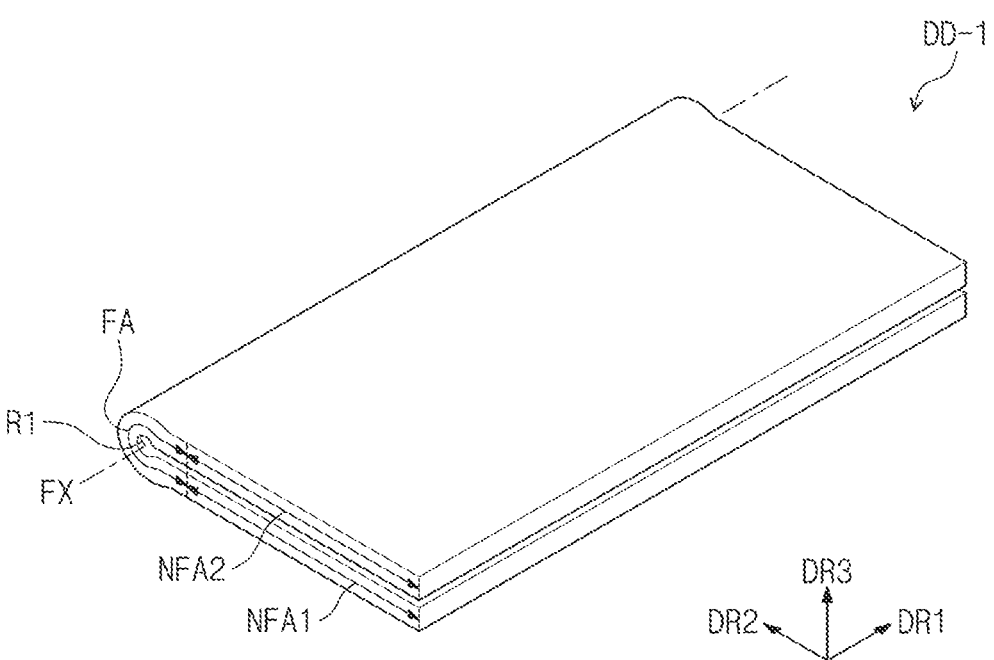

FIGS. 8A to 8c are perspective views of a display device according to an embodiment of the invention. FIG. 8A illustrates an unfolded state, and FIGS. 8B and 8C illustrate a folded state. FIGS. 8A to 8C illustrate a display device according to an embodiment, which is different from the display device DD illustrated in FIGS. 1A to 6 and the like.

Referring to FIGS. 8A to 8C, a display device DD-1 according to an embodiment of the invention may include a display surface DS defined by a first direction DR1 and a second direction DR2 crossing the first direction DR1. The display device DD-1 may provide an image IM to a user through the display surface DS.

The display surface DS may include a display area DA and a non-display area NDA around the display area DA. The display area DA may display the image IM, and the non-display area NDA may not display the image IM. The non-display area NDA may surround the display area DA. However, an embodiment of the invention is not limited thereto, and a shape of the display area DA and a shape of the non-display area NDA may be changed.

The display surface DS may include a sensing area TA. The sensing area TA may be a partial area of the display area DA, that is, an image is displayed in the sensing area TA. The sensing area TA has transmittance greater than that of each of other areas of the display area DA. Hereinafter, other areas of the display area DA except for the sensing area TA may be defined as a general display area.

An optical signal, for example, visible light or infrared light may transmit to the sensing area TA. The display device DD-1 may capture an external image through the visible light passing through the sensing area TA or determine accessibility of an external object through the infrared light. Although an embodiment including a single sensing area TA is illustrated as an example in FIG. 8A, the embodiment of the invention is not limited thereto, and a plurality of sensing areas TA may be provided.

The display device DD-1 may include a folding area FA and a plurality of non-folding areas NFA1 and NFA2. The non-folding areas NFA1 and NFA2 may include a first non-folding area NFA1 and a second non-folding area NFA2. In the second direction DR2, the folding area FA may be disposed between the first non-folding area NFA1 and the second non-folding area NFA2.

As illustrated in FIG. 8B, the folding area FA may be folded based on a folding axis FX parallel to the first direction DR1. The folding area FA has a predetermined curvature and a curvature radius in a folded state. The first non-folding area NFA1 and the second non-folding area NFA2 may face each other, and the display device DD-1 may be in-folded so that the display surface DS is not exposed to the outside.

Although not shown, the display device DD-1 may be out-folded so that the display surface DS is exposed to the outside. According to an embodiment of the invention, the display device DD-1 may be configured to repeatedly perform an in-folding operation or an out-folding operation from an unfolding operation, but is not limited thereto. In an embodiment of the invention, the display device DD-1 may be configured to selectively perform any one of the unfolding operation, the in-folding operation, and the out-folding operation.

In an embodiment, as illustrated in FIG. 8B, a distance between the first non-folding area NFA1 and the second non-folding area NFA2 may be substantially equal to a curvature radius R1. In an alternative embodiment, as illustrated in FIG. 8C, a distance between the first non-folding area NFA1 and the second non-folding area NFA2 may be less than the curvature radius R1. FIGS. 8B and 8C are views based on the display surface DS, and a housing HM (see FIG. 9A) defining an outer appearance of the display device DD-1 may contact at end areas of a first non-folding area NFA1 and a second non-folding area NFA1.

Figure 9A:
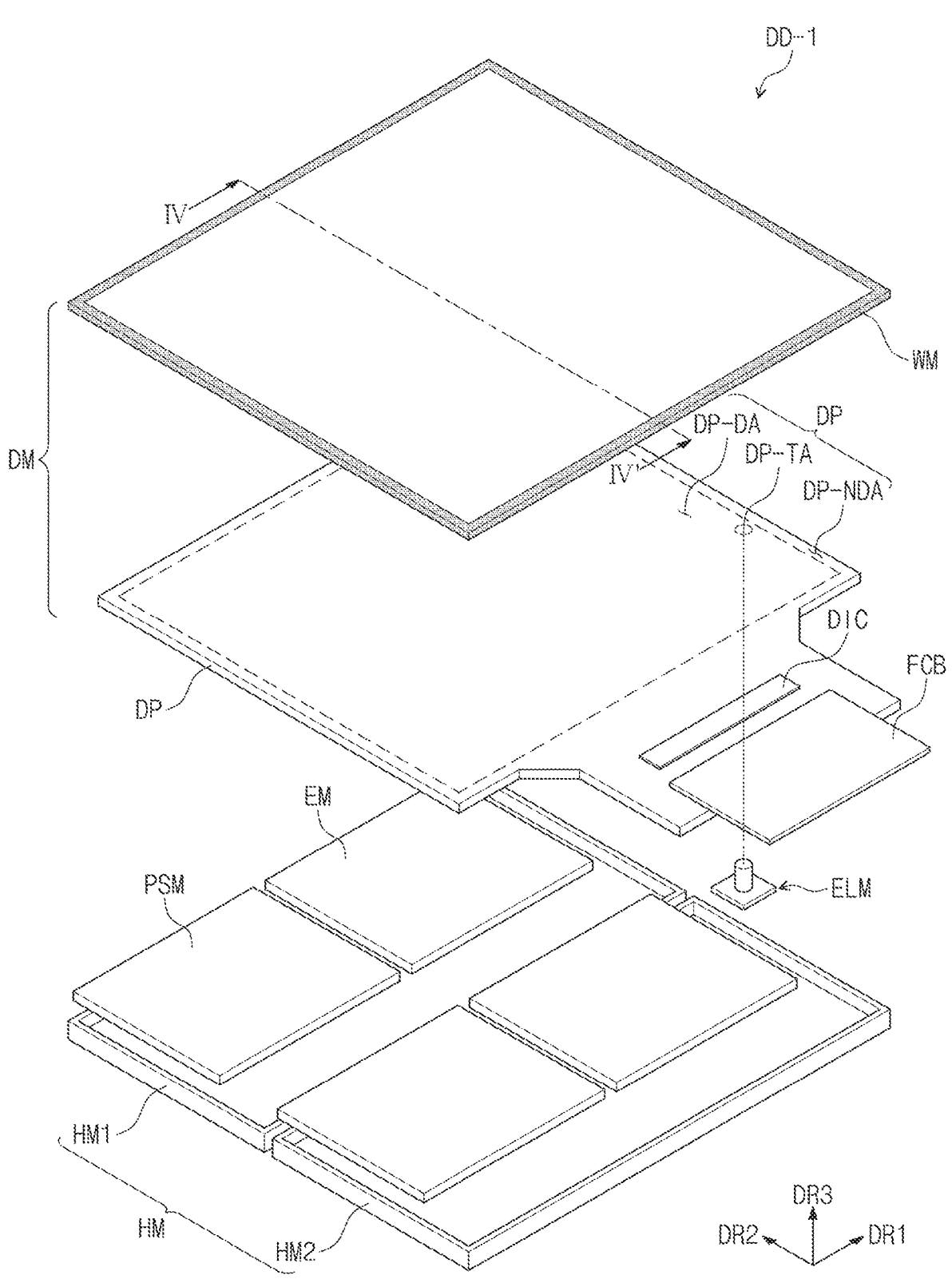
FIG. 9A is an exploded perspective view of the display device according to an embodiment of the invention.
Figure 9B:
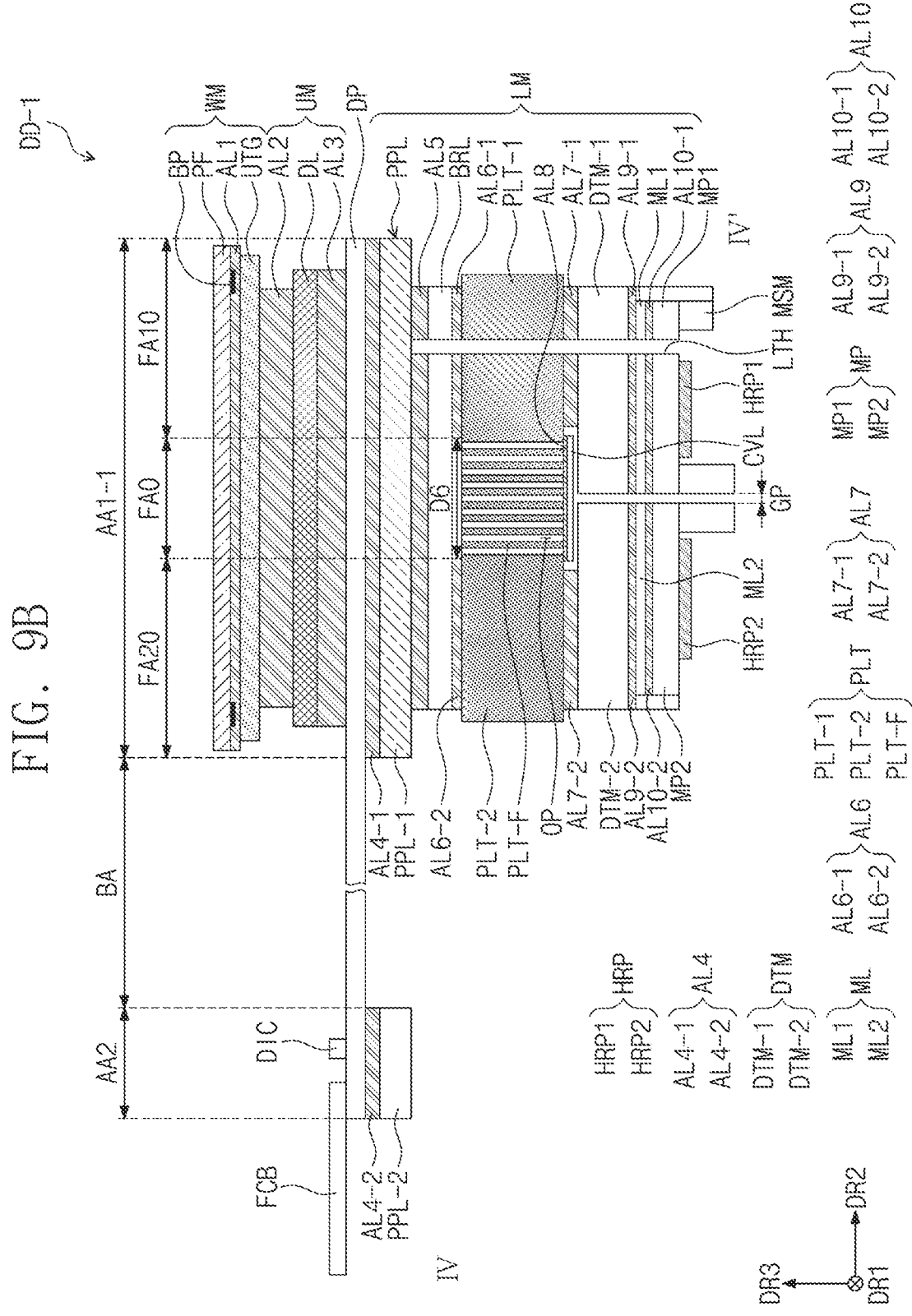
FIG. 9B is a cross-sectional view of the display device according to an embodiment of the invention.

FIG. 9A is an exploded perspective view of the display device according to an embodiment of the invention. FIG. 9B is a cross-sectional view of the display device according to an embodiment of the invention. FIG. 9B illustrates a cross-section taken along line IV-IV' of FIG. 9A.

Referring to FIGS. 9A and 9B, an embodiment of the display device DD-1 may include a display module DM, an electronic module EM, an electro-optical module ELM, a power module PSM, and a housing HM. Although not shown separately, the display device DD-1 may further include a mechanical structure (e.g., a hinge structure) for controlling a folding operation of the display device DD-1.

The display module DM generates an image and detects an external input. The display module DM includes a window WM and a display panel DP. The window WM provides a front surface of the display device DD-1.

The display module DM may include a display panel DP. In an embodiment, although not shown in FIG. 9A, the display module DM may substantially further include a plurality of components disposed above the display panel DP.

The display panel DP is not particularly limited and may be, for example, a light emitting display panel such as an organic light emitting display panel or a quantum dot light emitting display panel. The display panel DP may be a display panel including a micro light emitting device such as a micro LED or a nano LED.

The display panel DP may include a display area DA (see FIG. 8A) of the display device DD-1, a display area DP-DA corresponding to the non-display area NDA (see FIG. 8A), and a non-display area DP-NDA.

The display panel DP may include a sensing area DP-TA corresponding to a sensing area TA of FIG. 8A. The sensing area TA may have a resolution less than that of the display area DP-DA. The sensing area DP-TA will be described later in greater detail.

As illustrated in FIG. 9A, a driving chip DIC may be disposed on the non-display area DP-NDA of the display panel DP. A flexible circuit board FCB may be coupled to the non-display area DP-NDA of the display panel DP. The flexible circuit board FCB may be connected to a main circuit board. The main circuit board may be an electronic component constituting the electronic module EM.

The driving chip DIC may include driving elements for driving pixels of the display panel DP, for example, a data driving circuit. FIG. 9A illustrates an embodiment having a structure in which the driving chip DIC is mounted on the display panel DP, but the embodiment of the invention is not limited thereto. In an alternative embodiment, for example, the driving chip DIC may be mounted on the flexible circuit board FCB.

Referring to FIG. 9A, in an embodiment, the electronic module EM may be disposed in each of a first housing HM1 and a second housing HM2, and the power module PSM may be disposed in each of the first housing HM1 and the second housing HM2. Although not shown, the electronic module EM disposed in the first housing HM1 and the electronic module EM disposed in the second housing HM2 may be electrically connected to each other through the flexible circuit board. The electronic module EM may include a control module for controlling an operation of the display device DD-1. The electronic module EM may include a wireless communication module, an image input module, an audio input/output module, a memory, an external interface module, or the like in addition to the control module.

The power module PSM supplies power for an overall operation of the electronic device ED. The power module PSM may include a typical battery device.

The electro-optical module ELM may be an electronic component that outputs or receives an optical signal. The electro-optical module ELM may include a camera module and/or a proximity sensor. The camera module may capture an external image through the sensing area DP-TA. The proximity sensor may receive an external signal recognized through the sensing area DP-TA.

The housing HM illustrated in FIG. 9A is coupled to the display device DD, particularly, the window WM to accommodate other modules. The housing HM is illustrated as including first and second housings HU1 and HU2 separated from each other, but is not limited thereto. Although not shown, the display device DD-1 may further include a hinge structure for connecting the first and second housings HU1 and HU2 to each other.

FIGS. 9A and 9B illustrate an embodiment in an unfolded state in which the display panel DP is not bent. In a state in which the display panel DP is included and coupled other elements in the display device DD-1 illustrated in FIGS. 8A to 8C, a bending area BA may be bent so that a second area AA2-1 may be disposed below a first area AA1-1. In the bent state, the bending area BA has a predetermined curvature or a predetermined radius of curvature. The radius of curvature may be in a range of about 0.1 millimeter (mm) to about 0.5 mm.

Referring to FIG. 9B, the display device DD includes a window WM, an upper member UM, a display panel DP, and a lower member LM. The upper member UM refers to a structure disposed between the window WM and the display panel DP, and the lower member LM refers to a structure disposed below the display panel DP.

The window WM may include a thin glass substrate UTG, a window protective layer PF disposed on the thin glass substrate UTG, and a bezel pattern BP disposed on a bottom surface of the window protective layer PF. In an embodiment, the window protective layer PF may include a synthetic resin film. The window WM may further include an adhesive layer AL1 (hereinafter, referred to as a first adhesive layer) bonding the window protective layer PF to the thin glass substrate UTG.

The bezel pattern BP overlaps the non-display area NDA illustrated in FIG. 8A. The bezel pattern BP may be disposed on one surface of the thin glass substrate UTG or one surface of the window protective layer PF. FIG. 9B illustrates an embodiment where the bezel pattern BP disposed on the bottom surface of the window protective layer PF as an example. The embodiment of the invention is not limited thereto, and the bezel pattern BP may be disposed on the top surface of the window protective layer PF. The bezel pattern BP may be provided as a colored light blocking layer, for example, in a coating manner. The bezel pattern BP may include a base material and a dye or pigment mixed with the base material.

The thin glass substrate UTG may have a thickness in a range of about 15 μm to about 45 μm. The thin glass substrate UTG may have a thickness of, for example, about 30 μm. The thin glass substrate UTG may be chemically strengthened glass such that an occurrence of wrinkles may be minimized even if the thin glass substrate UTG is repeatedly folded and unfolded.

The window protective layer PF may have a thickness in a range of about 50 μm to about 80 μm. The window protective layer PF may have a thickness of, for example, about 70 μm. The window protective layer PF may include polyimide, polycarbonate, poly amide, triacetylcellulose, polymethylmethacrylate, or polyethylene terephthalate. Although not shown separately, at least one selected from a hard coating layer, an anti-fingerprint layer, and an anti-reflection layer may be disposed on a top surface of the window protective layer PF.

The first adhesive layer AL1 may be a pressure sensitive adhesive film (PSA) or an optically clear adhesive (OCA). Adhesive layers to be described below are substantially the same as the first adhesive layer ALL The first adhesive layer AL1 may be separated from the thin glass substrate UTG. Since strength of the window protective layer PF is lower than that of the thin glass substrate UTG, scratches may occur relatively easily in the window protective layer PF. After the first adhesive layer AL1 and the window protective layer PF are separated from each other, a new window protective layer PF may be attached to the thin glass substrate UTG. The first adhesive layer AL1 may have a thickness of, for example, about 20 μm to about 50 μm.

In an embodiment, on a plane, an edge of the thin glass substrate UTG may not overlap the bezel pattern BP. In such an embodiment, the edge of the thin glass substrate UTG may be exposed from the bezel pattern BP, and fine cracks generated in the edge of the thin glass substrate UTG may be inspected through an inspection device.

In an embodiment, the upper member UM includes an upper film DL. The upper film DL may include a synthetic resin film. The synthetic resin film may include polyimide, polycarbonate, polyamide, triacetylcellulose, polymethylmethacrylate, or polyethylene terephthalate.

The upper film DL may absorb an external impact applied to the front surface of the display device DD. In an alternative embodiment of the invention, the upper film DL may be omitted. The upper film DL may have a thickness of about 10 μm to about 40 μm. The upper film DL may have a thickness of, for example, about 23 μm.

The upper member UM may include a second adhesive layer AL2 bonding the upper film DL to the window WM and a third adhesive layer AL3 bonding the upper film DL to the display panel DP. The second adhesive layer AL2 may have a thickness in a range of about 50 μm to about 100 μm. The second adhesive layer AL2 may have a thickness of, for example, about 75 micrometers. Third adhesive layer AL3 may have a thickness in a range of about 30 micrometers to about 70 μm.

In an embodiment, the lower member LM may include a protective layer PPL, a barrier layer BRL, a support member PLT, a cover layer CVL, a digitizer DTM, a metal layer ML, a metal plate MP, a heat dissipation layer HRP, and fourth to tenth adhesive layers AL4 to AL10. Each of the fourth to tenth adhesive layers AL4 to AL10 may include an adhesive such as a pressure-sensitive adhesive or an optically transparent adhesive. Some of the above-described constituents according to an embodiment of the invention may be omitted. In an embodiment, for example, the metal plate MP or the heat dissipation layer HRP and the adhesive layer may be omitted.

The protective layer PPL is disposed below the display panel DP. The protective layer PPL may protect a lower portion of the display panel DP. The protective layer PPL may include a flexible synthetic resin film. The flexible synthetic resin film provided in the protective layer PPL may be a heat-resistant synthetic resin film. The protective layer PPL may include, for example, heat-resistant polyethylene terephthalate. However, the embodiment of the invention is not limited thereto, and alternatively, the protective layer PPL may include a heat-resistant synthetic resin material such as polyamide imide, polyether ether ketone, polyphenylene sulfide, or the like.

In an embodiment of the invention, the protective layer PPL may not be disposed on the bending area BA. The protective layer PPL may include a first protective layer PPL-1 protecting a first area AA1-1 of the display panel DP (see FIG. 3A) and a second protective layer PPL-2 protecting a second area AA2-1 of the display panel DP (see FIG. 3A).

The fourth adhesive layer AL4 bonds the protective layer PPL to the display panel DP. The fourth adhesive layer AL4 may include a first portion AL4-1 corresponding to the first protective layer PPL-1 and a second portion AL4-2 corresponding to the second protective layer PPL-2. In this specification, the fourth adhesive layer AL4 may be referred to as an upper adhesive layer. The fourth adhesive layer AL4 may have a thickness in a range of about 15 μm to about 35 μm. In an embodiment, for example, the fourth adhesive layer AL4 may have a thickness of about 25 μm.

When the bending area BA is bent, the second protective layer PPL-2 may be disposed below the first area AA1-1 and the first protective layer PPL-1 together with the second area AA2-1. Since the protective layer PPL is not disposed on the bending area BA, the bending area BA may be more easily bent. The second protective layer PPL-2 may be attached below the metal plate MP through an additional adhesive layer AL11. In an alternative embodiment, the additional protective layer 11 may be omitted.

In an embodiment, a bending protective layer (not shown) may be disposed on at least the bending area BA. The bending protective layer may overlap the bending area BA, the first area AA1-1, and the second area AA2-1. The bending protective layer may be disposed on a portion of the first area AA1-1 and a portion of the second area AA2-1.

The bending protective layer may be bent together with the bending area BA. The bending protective layer protects the bending area BA from an external impact and controls a neutral plane of the bending area BA. The bending protective layer controls stress of the bending area BA so that the neutral plane approaches the signal lines disposed on the bending area BA.

In an embodiment, as illustrated in FIG. 9B, a fifth adhesive layer AL5 bonds the protective layer PPL to the barrier layer BRL. The barrier layer BRL may be disposed below the protective layer PPL. The barrier layer BRL may improve resistance to compressive force due to external pressing. Thus, the barrier layer BRL may serve to prevent deformation of the display panel DP from occurring. The barrier layer BRL may include a flexible plastic material such as polyimide or polyethylene terephthalate. In an embodiment, the barrier layer BRL may be a colored film having low light transmittance. The barrier layer BRL may absorb light incident from the outside. In an embodiment, for example, the barrier layer BRL may be a black synthetic resin film. When viewing the display device DD from an upper side of the window protective layer PF, the components disposed below the barrier layer BRL may not be visually recognized by the user. The battier layer BRL may have a thickness in a range of about 30 μm to about 80 μm.

The sixth adhesive layer AL6 bonds the barrier layer BRL to the support member PLT. The sixth adhesive layer AL6 may include a first portion AL6-1 and a second portion AL6-2, which are spaced apart from each other. A spaced distance D6 between the first portion AL6-1 and the second portion AL6-2 corresponds to a width of a folding area FA0 and is greater than a gap GP to be described later. The spaced distance D6 between the first portion AL6-1 and the second portion AL6-2 may be in a range of about 7 mm to about 15 mm, e.g., in a range of about 9 mm to about 13 mm.

In such an embodiment, the first portion AL6-1 and the second portion AL6-2 are defined by different portions of one adhesive layer, but is not limited thereto. Alternatively, the first portion AL6-1 is defined by one adhesive layer (e.g., the first adhesive layer or the second adhesive layer), and the second portion AL6-2 may be defined by another adhesive layer (e.g., the second adhesive layer or the third adhesive layer). Such features may be applied not only to the sixth adhesive layer AL6 but also to adhesive layers including the two portions among adhesive layers to be described later.

In this specification, each of the fifth adhesive layer AL5 and the sixth adhesive layer AL6 may be referred to as a lower adhesive layer. Each of the fifth and sixth adhesive layers AL5 and AL6 may have a thickness in a range of about 15 μm to about 35 μm.

The support member PLT is disposed below the barrier layer BRL. The support member PLT supports components disposed above the support layer and maintains the unfolded state and the folded state of the display device DD. The support member PLT has strength greater than that of the barrier layer BRL. The support member PLT includes a first support portion PLT-1 corresponding to at least a first non-folding area NFA10 and a second support portion PLT-2 corresponding to a second non-folding area NFA20. The first support portion PLT-1 and the second support portion PLT-2 are spaced apart from each other in the second direction DR2. The support member PLT may have a thickness in a range of about 150 μm to about 200 μm.

In an embodiment, the support member PLT may include a folding portion PLT-F which corresponds to the folding area FA0 and is disposed between the first support portion PLT-1 and the second support portion PLT-2 and in which a plurality of openings OP are defined. The plurality of openings OP may be arranged so that the folding area FA0 has a lattice shape on a plane. The first support portion PLT-1, the second support portion PLT-2, and the folding portion PLT-F may have an integral shape.

The folding portion PLT-F may prevent foreign substance from being permeated into a central area of the barrier layer BRL opened from the first support portion PLT-1 and the second support portion PLT-2 during the folding operation illustrated in FIGS. 8B and 8C. Flexibility of the folding portion PLT-F is improved by the plurality of openings OP. In addition, since the sixth adhesive layer AL6 is not disposed on the folding portion PLT-F, flexibility of the support member PLT may be improved. In an alternative embodiment of the invention, the folding portion PLT-F may be omitted. In such an embodiment, the support member PLT includes a first support portion PLT-1 and a second support portion PLT-2, which are spaced apart from each other.

The support member PLT may include at least one material selected from materials capable of transmitting an electromagnetic field generated by the digitizer DTM to be described later without a loss or with a minimal loss. The support member PLT may include a non-metal material. The support member PLT may include a reinforcing fiber composite. The support member PLT may include reinforcing fibers disposed inside a matrix part. In an embodiment, the reinforcing fiber may include a carbon fiber or a glass fiber. The matrix part may include a polymer resin. The matrix part may include a thermoplastic resin. In an embodiment, for example, the matrix part may include a polyamide-based resin or a polypropylene-based resin. In an embodiment, for example, the reinforcing fiber composite may be carbon fiber reinforced plastic (CFRP) or glass fiber reinforced plastic (GFRP).

The cover layer CVL and the digitizer DTM are disposed below the support member PLT. The cover layer CVL is disposed to overlap the folding area FA0. The digitizer DTM may include a first digitizer DTM-1 and a second digitizer DTM-2 respectively overlapping the first support portion PLT-1 and the second support portion PLT-2. A portion of each of the first digitizer DTM-1 and the second digitizer DTM-2 may be disposed below the cover layer CVL.

The seventh adhesive layer AL7 bonds the support member PLT to the digitizer DTM, and the eighth adhesive layer AL8 bonds the cover layer CVL to the support member PLT. The seventh adhesive layer AL7 includes a first portion AL7-1 bonding the first support portion PLT-1 to the first digitizer DTM-1 and a second portion AL7-2 bonding the second support portion PLT-2 to the second digitizer DTM-2.

The cover layer CVL may be disposed between the first portion AL7-1 and the second portion AL7-2 in the second direction DR2. The cover layer CVL shown in FIG. 9B is substantially the same as those described above. The contents described with reference to FIGS. 6, 7A, and 7B may be equally applied to the cover layer CVL.

The digitizer DTM may also be called as an electromagnetic resonance (EMR) sensing panel and may include a plurality of loop coils that generate a magnetic field having a preset resonant frequency with respect to an electronic pen. The magnetic field generated in the loop coils may be applied to an LC resonance circuit constituted by an inductor (coil) and a capacitor of the electronic pen. The coils may generate current by the received magnetic field and transfer the generated current to the capacitor. Thus, the capacitor may charge the current input from the coil and discharge the charged current to the coil. As a result, the magnetic fields of the resonant frequency are emitted to the coil. The magnetic field emitted by the electronic pen may be absorbed again by the loop coils of the digitizer, and thus, a proximate position of the electronic pen on a touch screen may be determined.

The first digitizer DTM-1 and the second digitizer DTM-2 are spaced a predetermined gap GP from each other. The gap GP may be in a range of about 0.3 mm to about 3 mm and may be disposed to correspond to the folding area FA0.

A metal layer ML is disposed below the digitizer DTM. The metal layer ML may include a first metal layer ML1 and a second metal layer ML2, which respectively overlap the first support portion PLT-1 and the second support portion PLT-2. The metal layer ML may release heat generated when the digitizer DTM is driven to the outside. The metal layer ML transfers the heat generated by the digitizer DTM to a lower side. The metal layer ML may have electrical conductivity and thermal conductivity greater than those of a metal plate to be described later. The metal layer ML may include copper or aluminum.

The ninth adhesive layer AL9 bonds the digitizer DTM to the metal layer ML. The ninth adhesive layer AL9 may include a first portion AL9-1 and a second portion AL9-2, which respectively correspond to the first metal layer ML1 and the second metal layer ML2.

The metal plate MP is disposed below the metal layer ML. The metal plate MP may include a first metal plate MP1 and a second metal plate MP2, which respectively overlap the first metal layer ML1 and the second metal layer ML2. The metal plate MP may absorb an external impact applied from the lower side.

The metal plate MP may have strength and a thickness greater than those of the metal layer ML. The metal plate MP may include a metal material such as stainless steel.

The tenth adhesive layer AL10 bonds the metal layer ML to the metal plate MP. The tenth adhesive layer AL10 may include a first portion AL10-1 and a second portion AL10-2, which respectively correspond to the first metal plate MP1 and the second metal plate MP2.

A heat dissipation layer HRP may be disposed below the metal plate MP. The heat dissipation layer HRP may include a first heat dissipation layer HRP1 and a second heat dissipation layer HRP2, which respectively overlap the first metal plate MP1 and the second metal plate MP2. The heat dissipation layer HRP releases heat generated from electronic components disposed at the lower side. The electronic components may be the electronic module EM illustrated in FIGS. 2A and 2B. The heat dissipation layer HRP may have a structure in which an adhesive layer and a graphite layer are alternately laminated. The outermost adhesive layer may be attached to the metal plate MP.

A magnetic field shielding sheet MSM is disposed below the metal plate MP. The magnetic field shielding sheet MSM shields the magnetic field generated by a magnetic body (not shown) disposed at the lower side. The magnetic field shielding sheet MSM may prevent the magnetic field generated from the magnetic material from interfering with the digitizer DTM.

The magnetic field shielding sheet MSM includes a plurality of portions. At least one of the plurality of portions may have a different thickness from that of another portion. The plurality of portions may be disposed to correspond to stepped portions of a bracket (not shown) disposed below the display device DD. The magnetic field shielding sheet MSM may have a structure in which the magnetic field shielding layer and the adhesive layers are alternately laminated. A portion of the magnetic field shielding sheet MSM may be directly attached to the first metal plate MP1, and a portion of the magnetic field shielding sheet MSM may be directly attached to the second metal plate MP2.

A through-hole LTH may be defined in some members of the lower members LM. The through-hole LTH is defined to overlap the sensing area DP-TA of FIG. 9A. As illustrated in FIG. 9B, the through-hole LTH may pass from the fifth adhesive layer AL5 to the metal plate MP. The through-hole LTH may have a structure that is similar to a structure from which the light blocking structure is removed from a path of the optical signal, and the through-hole LTH may improve optical signal reception efficiency of the electro-optical module ELM.

According to an embodiment of the invention, the surface of the elastic layer may be effectively prevented from being visually recognized from the outside to improve the surface quality of the elastic layer, and also, the modulus of the elastic layer may be effectively prevented from increasing under a low-temperature condition. Therefore, the occurrence of the defects such as the cracks in the display panel may be effectively prevented to improve the durability of the display device including the display panel and the cover layer.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a display panel comprising a first area and a second area, which are arranged in a first direction;
   a cover layer disposed on a rear surface of the display panel to overlap the first area;
   an adhesive layer which attaches the cover layer to the display panel;
   a first support layer disposed below the cover layer to overlap the first area, wherein a plurality of openings is defined in the first support layer; and
   a second support layer disposed on the rear surface of the display panel to overlap the second area and spaced apart from the cover layer in the first direction,
   wherein the cover layer comprises:
      an elastic layer comprising an elastomer; and
      a primer layer disposed on a surface of the elastic layer and comprising a light blocking material.

2. The display device of claim 1, wherein the elastic layer comprises at least one selected from thermoplastic polyurethane, silicone, elastolefin, thermoplastic olefin, polyamide, polyether block amide, synthetic polyisoprene, polybutadiene, fluoroelastomer, and ethylene-vinyl acetate.

3. The display device of claim 1, wherein the elastic layer is consisting of the elastomer.

4. The display device of claim 1, wherein the elastic layer does not comprise the light blocking material.

5. The display device of claim 1, wherein the primer layer comprises a base resin and a light blacking material dispersed in the base resin.

6. The display device of claim 5, wherein the primer layer comprises about 70 wt % or greater and about 85 wt % or less of the base resin, and about 15 wt % or greater and about 30 wt % or less of the light blocking material, based on a total content of the primer layer.

7. The display device of claim 1, wherein the elastic layer comprises a top surface adjacent to the display panel and a bottom surface adjacent to the first support layer, and the primer layer comprises a first primer layer disposed on the top surface and a second primer layer disposed on the bottom surface.

8. The display device of claim 1, wherein the elastic layer comprises a top surface adjacent to the display panel, and the primer layer is disposed directly on the top surface of the elastic layer, and the adhesive layer is disposed directly on a top surface of the primer layer.

9. The display device of claim 1, wherein the primer layer has a thickness of about 0.5 μm or greater and about 2 μm or less.

10. The display device of claim 1, wherein the elastic layer has a modulus of about 150 MPa or greater and about 300 MPa or less under a temperature of about −20° C.

11. The display device of claim 1, wherein the plurality of openings is arranged in a lattice shape on a plane.

12. The display device of claim 1, wherein at least a portion of the first area of the display panel is foldable about an axis extending in a second direction crossing the first direction.

13. The display device of claim 12, wherein the display panel further comprises a third area spaced apart from the second area with the first area therebetween, and a top surface of the second area and a top surface of the third area face each other in a state where at least a portion of the first area is folded.

14. The display device of claim 1, further comprising:

a plurality of support bars disposed below the first support layer to be spaced apart from each other in the first direction, wherein each of the plurality of support bars extends in a second direction crossing the first direction.

15. The display device of claim 14, wherein the plurality of support bars do not overlap the plurality of openings on a plane.

16. A display device comprising:

a display panel comprising a first area and a second area, which are arranged in a first direction;

a cover layer disposed on a rear surface of the display panel to overlap the first area;

an adhesive layer which attaches the cover layer to the display panel; and a support layer disposed below the cover layer, wherein a plurality of openings is defined in the support layer to overlap the first area, wherein the cover layer comprises:

an elastic layer comprising thermoplastic polyurethane; and a primer layer disposed on a surface of the elastic layer and comprising polyurethane and a light blocking material.

17. The display device of claim 16, further comprising:

wherein the primer layer is disposed on directly the surface of the elastic layer, and the adhesive layer is disposed directly on a top surface of the primer layer.

18. The display device of claim 16, wherein the primer layer comprises about 70 wt % or greater and about 85 wt % or less of the polyurethane, and about 15 wt % or greater and about 30 wt % or less of the light blocking material, based on a total content of the primer layer.

19. A display device operating in a first mode and a second mode in which a display surface is expanded when a mode is changed from the first mode to the second mode, the display device comprising:

a display panel comprising a first area and a second area, which are arranged in a first direction;

a cover layer disposed on a rear surface of the display panel to overlap the first area; and an adhesive layer which attaches the cover layer to the display panel, wherein, at least a portion of the first area is foldable in the first mode, and the cover layer comprises:

an elastic layer comprising an elastomer; and a primer layer disposed on a surface of the elastic layer and comprising a light blocking material.

* * * * *